US009830990B2

(12) United States Patent
Izumi et al.

(10) Patent No.: US 9,830,990 B2
(45) Date of Patent: Nov. 28, 2017

(54) SEMICONDUCTOR MEMORY DEVICE

(71) Applicant: Rohm Co., Ltd., Kyoto (JP)

(72) Inventors: Shintaro Izumi, Kobe (JP); Tomoki Nakagawa, Kobe (JP); Hiroshi Kawaguchi, Kobe (JP); Masahiko Yoshimoto, Kobe (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/615,998

(22) Filed: Jun. 7, 2017

(65) Prior Publication Data

US 2017/0278558 A1 Sep. 28, 2017

Related U.S. Application Data

(62) Division of application No. 14/725,102, filed on May 29, 2015.

(30) Foreign Application Priority Data

Oct. 17, 2014 (JP) .................................. 2014-212787

(51) Int. Cl.
*G11C 14/00* (2006.01)
*G11C 29/08* (2006.01)
(Continued)

(52) U.S. Cl.
CPC ........ *G11C 14/0072* (2013.01); *G11C 11/221* (2013.01); *G11C 11/2259* (2013.01); *G11C 29/08* (2013.01); *G11C 29/50* (2013.01)

(58) Field of Classification Search
CPC ..... G11C 11/22; G11C 11/221; G11C 11/223; G11C 11/225; G11C 11/2253;
(Continued)

(56) References Cited

U.S. PATENT DOCUMENTS 5,058,067 A 10/1991 Kertis
5,381,364 A 1/1995 Chern
(Continued)

FOREIGN PATENT DOCUMENTS

JP 2001-076489 3/2001

OTHER PUBLICATIONS

Masui et al., "Design and Applications of Ferroelectric Nonvolatile SRAM and Flip-Flop with Unlimited Read/Program Cycles and Stable Recall," IEEE Custom Integrated Circuits, pp. 403-406 (2003).

(Continued)

*Primary Examiner* — Harry W Byrne
*Assistant Examiner* — R Lance Reidlinger
(74) *Attorney, Agent, or Firm* — Fish & Richardson P.C.

(57) ABSTRACT

Proposed as a configuration, a controlling method, and a testing method for a ferroelectric shadow memory are (1) a bit line non-precharge method, in which no precharging of a bit line is performed during a read/write operation; (2) a plate line charge share method, in which electric charge is shared between plate lines that are driven sequentially during store/recall operation; (3) a word line boost method, in which the potential on a word line is raised during a write operation; (4) a plate line driver boost method, in which the driving capacity of a plate line driver is raised during a store/recall operation; and (5) a testing method for detecting a defect in a ferroelectric capacitor by arbitrarily setting a potential on a bit line from outside a chip.

12 Claims, 40 Drawing Sheets

(51) Int. Cl.
*G11C 11/22* (2006.01)
*G11C 29/50* (2006.01)

(58) Field of Classification Search
CPC ............ G11C 11/2255; G11C 11/2257; G11C 11/2259; G11C 11/2273; G11C 11/2275; G11C 11/2277; G11C 11/2293; G11C 11/2295; G11C 11/2297; G11C 14/0072
See application file for complete search history.

(56) References Cited

U.S. PATENT DOCUMENTS

| | | | |
|---|---|---|---|
| 6,292,400 B1 * | 9/2001 | Dozza | G11C 16/08 365/185.25 |
| 6,816,401 B2 | 11/2004 | Kauffmann | |
| 6,924,999 B2 | 8/2005 | Masui | |
| 6,934,178 B2 | 8/2005 | Yokoseki | |
| 6,944,042 B2 | 9/2005 | Komatsuzaki | |

OTHER PUBLICATIONS

Miwa et al., "NV-SRAM: A Nonvolatile SRAM with Backup Ferroelectric Capacitors," IEEE Journal of Solid-State Circuits, 36(3):522-527 (2001).

* cited by examiner

FIG. 13

| | Area of WL driver [um$^2$] | Area of 1 block [um$^2$] |
|---|---|---|
| w/o capacitor | 20.1 | 213202 |
| Fe capacitor | 20.2 | 213215 |
| MOS capacitor | 31.3 | 214636 |
| MIM capacitor | 112.1 | 224978 |
| MOM capacitor | 151.1 | 229970 |

FIG. 24

| Process | 130nm |
|---|---|
| Temperature | 25°C |
| Power supply | 1.5V |
| Macro configuration | 16bits/word |
| # of cells/WL | 256 |
| # of cells/BL | 256 |

FIG. 26

|  | Write access time [ns] | Energy of WL driver [pJ] | Energy of 16Kb memory [pJ] |
|---|---|---|---|
| w/o boosting | 2.15 | 0.436 | 16.3 |
| w/ boosting | 1.81 | 0.644 | 16.5 |

TT corner, 25°C

FIG. 29

|  | PL charge time [ns] | Energy of PL driver [pJ] |
|---|---|---|
| w/o boosting | 10.47 | 46.3 |
| w/ boosting | 6.99 | 46.5 |

TT corner, 25°C

SEMICONDUCTOR MEMORY DEVICE

CROSS-REFERENCE TO RELATED APPLICATIONS

This application is a divisional of U.S. application Ser. No. 14/725,102, filed May 29, 2015 which claims the benefit of Japanese Patent Application No. 2014-212787 filed on Oct. 17, 2014, the contents of which are hereby incorporated by reference.

BACKGROUND OF THE INVENTION

1. Field of the Invention

The present invention relates to semiconductor memory devices.

2. Description of Related Art

Today, nonvolatile memories are widely used in system-on-chip (SoC) devices incorporated in a variety of applications. In particular, in applications with low active factors (such as in sensor networks and in living body monitoring), tight restrictions are imposed on electric power consumption during a standby period with a view to reducing battery capacity and system module size.

If, for the sake of discussion, a volatile memory (e.g., SRAM (static random-access memory)) is used as a data buffer in an application as mentioned above, the leak current through it may greatly affect the total electric power consumption of the system. On the other hand, when a nonvolatile memory is used as a data buffer, data can be held on a nonvolatile basis without supply of electric power, and this greatly contributes to power saving during a standby period. Thus, it can be said that a nonvolatile memory is very suitable as a data buffer in an application with a low active factor.

As a nonvolatile memory, FeRAM (ferroelectric random-access memory) is in practical use (e.g., in non-contact IC cards), which employs ferroelectric capacitors. FeRAM, however, is not quite satisfactory in driving speed and electric power consumption during an active period, and in durability.

To overcome the shortcomings of FeRAM, there has been proposed shadow memory having a 6T-4C structure (or a 6T-2C structure) which is a combination of SRAM having a 6T structure with a ferroelectric capacitor (hereinafter referred to as ferroelectric shadow memory).

A ferroelectric shadow memory operates as an SRAM having a 6T structure during an active period (during a data read/write operation), but stores data in a ferroelectric capacitor and becomes nonvolatile during a standby period. Thus, with a ferroelectric shadow memory, it is possible to achieve both high-speed operation during an active period and power saving (leak current reduction) during a standby period.

Examples of conventional technology related to the foregoing are seen in Non-Patent Documents 1 and 2 identified below.

Non-Patent Document 1: S. Masui, W. Yokozeki, et al., "Design and applications of ferroelectric nonvolatile SRAM and flip-flop with unlimited read/program cycles and stable recall", In Proc. of IEEE CICC, pp. 403-406, 2003.

Non-Patent Document 2: T. Miwa, J. Yamada, et al., "NV-SRAM: A Nonvolatile SRAM with Backup Ferroelectric Capacitors", IEEE JSSC, vol. 36, no. 3, pp. 522-527, 2001.

Inconveniently, however, compared with SRAM having a 6T structure, ferroelectric shadow memory has the following shortcomings: (1) high electric power consumption during an active period; (2) slow operation speed during an active period; and (3) difficulty detecting defects in ferroelectric capacitors due to production variations.

SUMMARY OF THE INVENTION

In view of the above-discussed problems found out by the present inventors, an object of the present invention is to provide a semiconductor memory device that achieves power saving during an active period, high-speed operation during an active period, and improved yields.

According to one embodiment disclosed herein, a semiconductor memory device includes: a plurality of memory cells; a word line commonly connected to the plurality of memory cells; a plurality of bit lines and a plurality of inverted bit lines respectively connected to the plurality of memory cells; and a memory controller operable to control access to the plurality of memory cells. Here, the plurality of memory cells each include: an inverter loop connected between a first node and a second node; a first access transistor connected between the first node and a bit line and turned on and off according to a voltage applied to the word line; a second access transistor connected between the second node and an inverted bit line and turned on and off according to a voltage applied to the word line; a first node capacitor connected to the first node and having a higher capacitance than a parasitic capacitor of the bit line; and a second node capacitor connected to the second node and having a higher capacitance than a parasitic capacitor of the inverted bit line. When accessing a memory cell that is a target of a read/write, the memory controller drives the word line to turn on the first and second access transistors without precharging a bit line and an inverted bit line that are connected to a memory cell that is not a target of the read/write.

According to another embodiment disclosed herein, a semiconductor memory device includes: a plurality of memory cells; a plurality of plate lines respectively connected to the plurality of memory cells; a plate line driver operable to drive the plurality of plate lines individually; and a memory controller operable to control access to the plurality of memory cells. Here, the plurality of memory cells each include: an inverter loop connected between a first node and a second node; a first access transistor connected between the first node and a bit line; a second access transistor connected between the second node and an inverted bit line; a first ferroelectric capacitor connected between the first node and a plate line; and a second ferroelectric capacitor connected between the second node and the plate line. When restoring/recalling data in the memory cells, the memory controller pulse-drives the plurality of plate lines sequentially by use of the plate line driver and meanwhile, before pulse-driving an uncharged plate line by use of the plate line driver, the memory controller performs charge sharing between a charged plate line and the uncharged plate line.

According to yet another embodiment disclosed herein, a word line driver includes: an output stage operable to drive a word line of a memory cell according to a word line enable signal; and a boost stage operable to raise the voltage applied to the word line to higher than a supply voltage to the output stage by driving a ferroelectric capacitor according to a boost enable signal.

According to still another embodiment disclosed herein, a plate line driver includes: a first output stage operable to generate a second plate line enable signal according to a first plate line enable signal; a second output stage operable to drive a plate line of a memory cell according to the second plate line enable signal; and a boost stage operable to augment the driving capacity of the second output stage by lowering the second plate line enable signal to a negative voltage by driving a ferroelectric capacitor according to a boost enable signal.

According to a further embodiment disclosed herein, a semiconductor memory device includes: an inverter loop connected between a first node and a second node; a first access transistor connected between the first node and a bit line; a second access transistor connected between the second node and an inverted bit line; a first ferroelectric capacitor connected between the first node and a plate line; a second ferroelectric capacitor connected between the second node and the plate line; and an external terminal operable to apply arbitrary analog voltages to the bit line and the inverted bit line respectively.

These and other features, elements, steps, benefits, and characteristics of the present invention will become clear through the following detailed description of the best modes of carrying out the invention with reference to the accompanying drawings.

BRIEF DESCRIPTION OF THE DRAWINGS

FIG. 13 is a table of comparison of areas of different types of capacitor;

FIG. 24 is a table showing conditions for a simulation;

FIG. 26 is a table showing results of a simulation of word line boosting;

FIG. 29 is a table showing results of a simulation of plate line driver boosting;

DETAILED DESCRIPTION OF PREFERRED EMBODIMENTS

Figure 1:
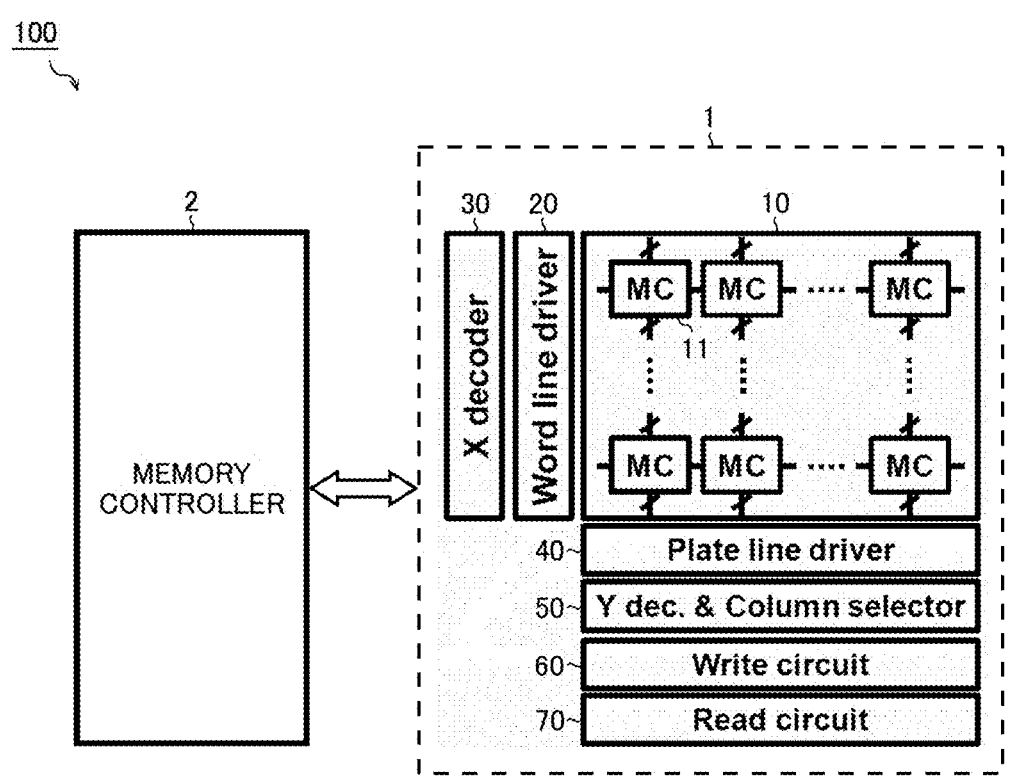
FIG. 1 is a block diagram showing an overall configuration of a semiconductor memory device.

Semiconductor Memory Device:

FIG. 1 is a block diagram showing an overall configuration of a semiconductor memory device. The semiconductor memory device of this configuration example includes a memory block 1 and a memory controller 2.

The memory block 1 is a circuit block for storing data, and includes a memory cell array 10, a word line driver 20, an X decoder 30, a plate line driver 40, a Y decoder/column selector 50, a write circuit 60, and a read circuit 70. The memory controller 2 is a circuit block for controlling access to the memory block 1 (and hence a plurality of memory cells 11), and suitably comprises a CPU (central processing unit) or the like.

The memory cell array 10 includes a plurality of memory cells 11 arrayed in a matrix. The memory cells 11 comprise ferroelectric shadow memory having a 6T-4C or 6T-2C structure. To the memory cells 11, there are connected word lines WL for controlling access during a read/write operation, bit lines BL and inverted bit lines XBL for inputting/outputting data during a read/write operation, and first plate lines PL1 and second plate lines PL2 for driving ferroelectric capacitors during a restore/recall operation, etc. The configuration and operation of the memory cells 11 will be described in detail later.

In response to an instruction from the X decoder 30, the word line driver 20 drives a word line WL that is connected to a memory cell 11 that is a target of a read/write operation.

In response to an instruction from the memory controller 2, the X decoder 30 drives the word line driver 20.

In response to an instruction from the Y decoder/column selector 50, the plate line driver 40 drives plate lines PL1 and PL2 that are connected to a memory cell 11 that is a target of a store/recall operation.

In response to an instruction from the memory controller 2, the Y decoder/column selector 50 drives the plate line driver 40. In response to an instruction from the memory controller 2, the Y decoder/column selector 50 makes a bit line BL and an inverted bit line XBL that are connected to a memory cell 11 that is a target of a read/write operation conduct selectively either to the write circuit 60 or to the read circuit 70.

According to data to be written to the memory cells 11, the write circuit 60 drives the bit lines BL and the inverted bit lines XBL.

The read circuit 70 includes a sense amplifier which compares voltages (amplify voltage differences) between the bit lines BL and the inverted bit lines XBL and thereby read data from the memory cells 11.

Figure 2:
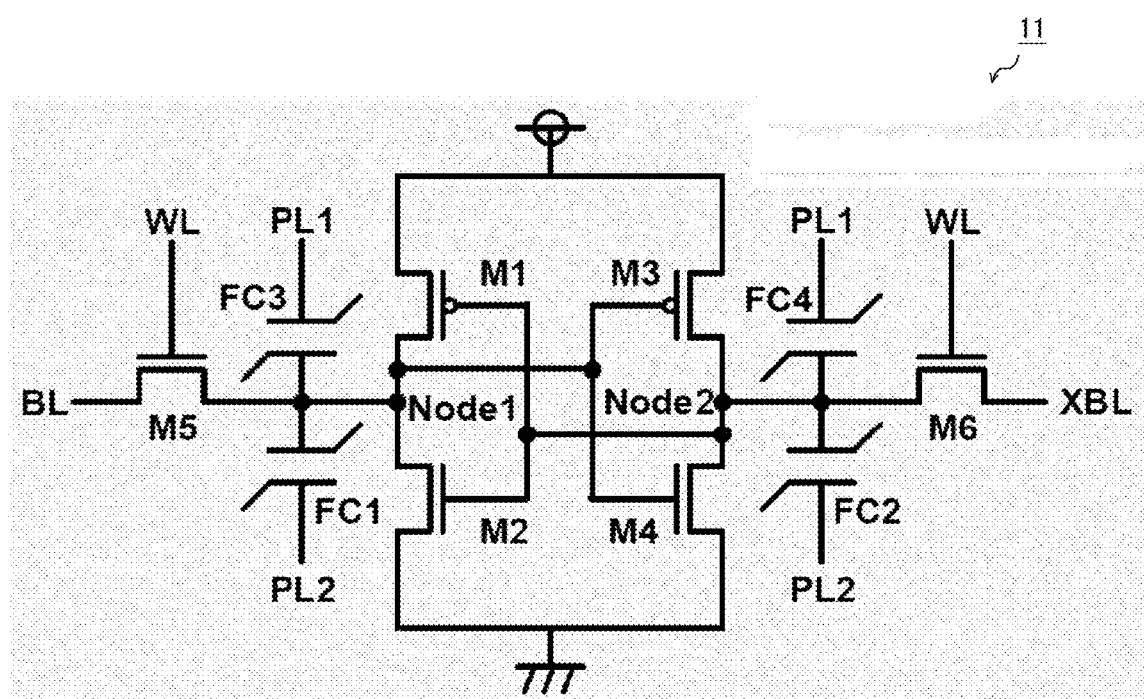
FIG. 2 is a circuit diagram showing one example of configuration of a memory cell 11.

Memory Cells:

FIG. 2 is a circuit diagram showing one example of the configuration of a memory cell 11. The memory cell 11 of this configuration example is a ferroelectric memory having a 6T-4C structure, and includes drive transistors M2 and M4 of an N-channel type, load transistors M1 and M3 of a P-channel type, access transistors M5 and M6 of an N-channel type, and ferroelectric capacitors FC1 to FC4. In the following description, for convenience' sake, the drive transistors M2 and M4, the load transistors M1 and M3, and the access transistors M5 and M6 are referred to simply as the transistors M1 to M6 respectively.

The sources of the transistors M1 and M3 are both connected to a supply power node. The drains of the transistors M1 and M2 and the gates of the transistors M3 and M4 are all connected to an internal node Node1. The drains of the transistors M3 and M4 and the gates of the transistors M1 and M2 are all connected to an internal node Node2. The sources of the transistors M2 and M4 are both connected to a ground node.

The transistors M1 and M2 constitute an inverter of which the input terminal is connected to the internal node Node2 and of which the output terminal is connected to the internal node Node1. The transistors M3 and M4 constitute an inverter of which the input terminal is connected to the internal node Node1 and of which the output terminal is connected to the internal node Node2. Thus, the transistors M1 to M4 function as an inverter loop connected between the internal nodes Node1 and Node2.

The transistor M5 is connected between the internal node Node1 and a bit line BL, and is turned on and off according to the voltage applied to a word line WL connected to the gate of the transistor M5. On the other hand, the transistor M6 is connected between the internal node Node2 and an inverted bit line XBL, and is turned on and off according to the voltage applied to a word line WL connected to the gate of the transistor M6.

The ferroelectric capacitor FC1 is connected between the internal node Node1 and a plate line PL2. The ferroelectric capacitor FC2 is connected between the internal node Node1 and the plate line PL2. The ferroelectric capacitor FC3 is connected between the internal node Node1 and a plate line PL1. The ferroelectric capacitor FC4 is connected between the internal node Node2 and the plate line PL1.

In the memory cell 11 configured as described above, the internal nodes Node1 and Node2 both function as storage nodes of the memory cell 11, and the voltages at those nodes have voltage levels that reflect logic data "0" or "1" stored at the memory cell 11.

Figure 3:
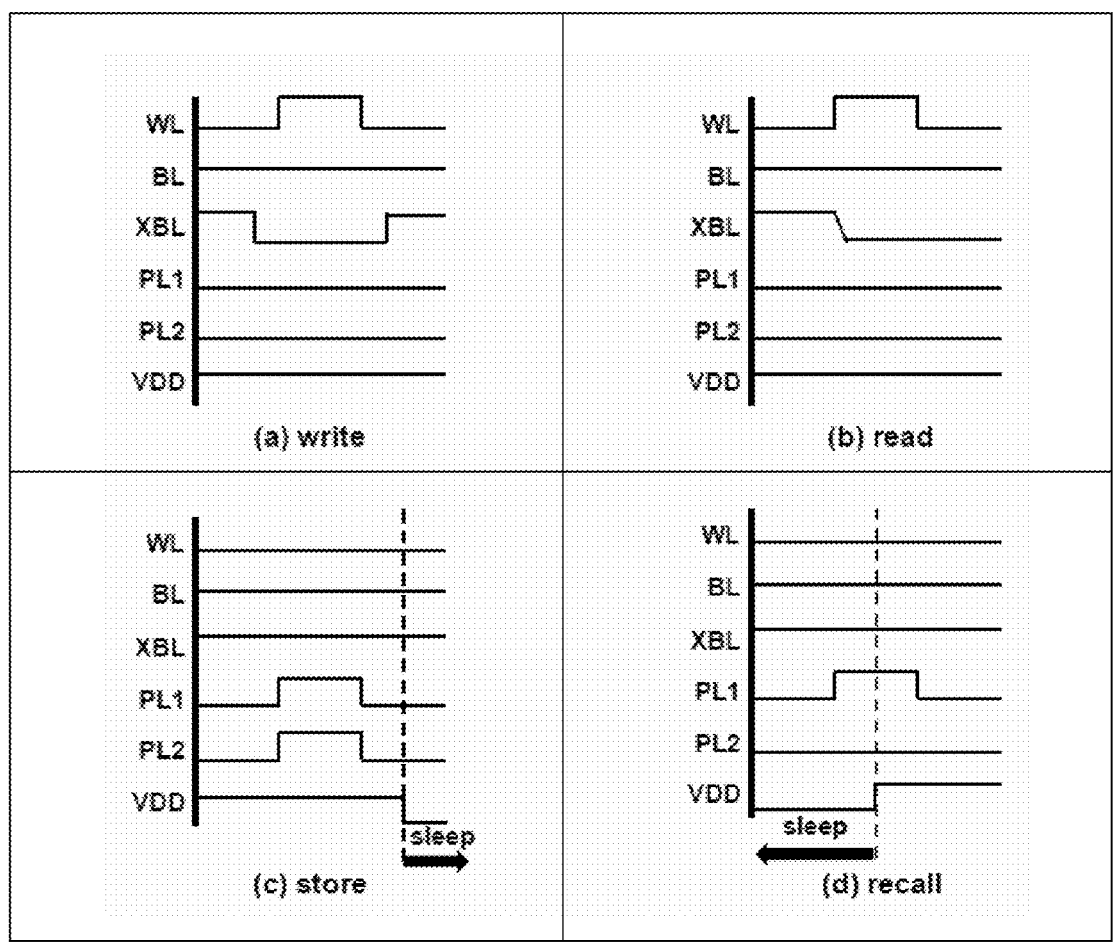
FIG. 3 is a timing chart showing one example of operation of a memory cell 11.

FIG. 3 is a timing chart illustrating one example of the operation of the memory cell 11 (a write operation in column (a), a read operation in column (b), a store operation in column (c), and a recall operation in column (d)). In each of columns (a) to (d) are shown, from top down, the word line WL, the bit line BL, the inverted bit line XBL, the plate lines PL1 and Pl2, and the supply voltage VDD (corresponding to an enabled or a disabled state of the inverter loop).

In a write operation in the memory cell 11, the word line WL is raised to high level, so that the transistors M5 and M6 turn on. At this point, if the bit line BL is at high level and the inverted bit line XBL is at low level, the transistors M1 and M4 turn on, and the transistors M2 and M3 turn off. As a result of the operation state of the inverter loop being definitively determined in this way, the internal node Node1 is held at high level, and the internal node Node2 is held at low level. This state corresponds to a state where logic data "1" is written to the memory cell 11, and is maintained so long as the supply voltage VDD is being supplied, even after the word line WL is lowered to low level. In contrast, logic data "0" can be written to the memory cell 11 by, while the word line WL is at high level, turning the bit line BL to low level and turning the inverted bit line XBL to high level. During a write operation in the memory cell 11, the plate lines PL1 and PL2 are both held at low level.

In a read operation in the memory cell 11, the bit line BL and the inverted bit line XBL are brought into a floating state, and the word line WL is raised to high level, so that the transistors M5 and M6 turn on. At this point, the voltages applied to the internal nodes Node1 and Node2 appear at the bit line BL and the inverted bit line XBL respectively. Thus, by comparing voltages (amplifying the voltage difference) between the bit line BL and the inverted bit line XBL, whether the logic data written to the memory cell 11 is "1" or "0" can be read out.

As described above, in the memory cell 11 having a 6T-4C structure, read/write operations are performed basically in the same manner as in SRAM having a 6T structure.

A store operation in the memory cell 11 is an operation in which data is transferred from the internal nodes Node1 and Node2 to the ferroelectric capacitors FC1 to FC4 so as to be made nonvolatile, and is performed during transition from an active state to a sleep state (before the supply of the supply voltage VDD to the inverter loop is shut off). More specifically, in a store operation in the memory cell 11, the plate lines PL1 and PL2 are both pulse-driven so as to determine the residual polarization states of the ferroelectric capacitors FC1 to FC4.

Consider, for example, a case where logic data "1" is stored in the memory cell 11, that is, the internal node Node1 is at high level and the internal node Node2 is at low level. In this case, while the plate lines PL1 and PL2 are kept at low level, no voltage is applied across either the ferroelectric capacitor FC2 or FC4, and voltages of opposite polarities are applied across the ferroelectric capacitors FC1 and FC3 respectively. On the other hand, while the plate lines PL1 and PL2 are kept at high level, no voltage is applied across either the ferroelectric capacitor FC2 or FC4, and voltages of opposite polarities are applied across the ferroelectric capacitors FC1 and FC3 respectively. As a result, the residual polarization states of the ferroelectric capacitors FC1 to FC4 are such that the ferroelectric capacitors FC1 and FC3 have opposite polarities, that the ferroelectric capacitors FC2 and FC4 have opposite polarities, that the ferroelectric capacitors FC1 and FC2 have opposite polarities, and that the ferroelectric capacitors FC3 and FC4 have opposite polarities. When logic data "0" is stored in the memory cell 11, the residual polarization states of the ferroelectric capacitors FC1 to FC4 are quite the opposite of what is described above.

Thereafter, the supply of the supply voltage VDD is shut off, and transition from an active state to a sleep state takes place. Here, however, the residual polarization states of the ferroelectric capacitors FC1 to FC4 are held to be those before the power shut-off. This state corresponds to a state where data has been transferred from the internal nodes Node1 and Node2 to the ferroelectric capacitors FC1 to FC4 and has been made nonvolatile.

A recall operation in the memory cell 11 is an operation in which data is restored from the ferroelectric capacitors FC1 to FC4 to the internal nodes Node1 and Node2, and is performed during recovery from a sleep state to an active state (before the supply of the supply voltage VDD to the inverter loop is restarted). More specifically, in a recall operation in the memory cell 11, one of the plate lines PL1 and PL2 is pulse-driven, so that voltages that reflect the residual polarization states of the ferroelectric capacitors FC1 to FC4 are induced at the internal nodes Node1 and Node2.

Consider, for example, a case where logic data "1" is stored in the ferroelectric capacitors FC1 to FC4. In this case, when the plate line PL1 is switched from low level to high level, at the internal node Node1, according to the residual polarization states of the ferroelectric capacitors FC1 and FC3, a voltage wkH (weak high) that is high relative to the internal node Node2 is induced. On the other hand, at the internal node Node2, according to the residual polarization states of the ferroelectric capacitors FC2 and FC4, a voltage wkL (weak low) that is low relative to the internal node Node1 is induced. Thus, between the internal nodes Node1 and Node2, a voltage difference reflecting the residual polarization states of the ferroelectric capacitors FC1 to FC4 appears.

Thereafter, when the supply of the supply voltage VDD to the inverter loop is restarted, due to the amplifying action of the inverter loop, the internal node Node1 is raised from an unstable voltage wkH to high level, and the internal node Node2 is lowered from an unstable voltage wkL to low level. This state is a state where data has been restored from the ferroelectric capacitors FC1 to FC4 to the internal nodes Node1 and Node2. Incidentally, in a case where logic data "0" is stored in the ferroelectric capacitors FC1 to FC4, the voltages induced at the internal nodes Node1 and Node2 when the plate line PL1 is pulse-driven are quite the opposite from what is described above.

First Embodiment

Next, a description will be given of a bit line non-precharge method, in which the bit line and the inverted bit line are not precharged during a read/write operation.

Figure 4:
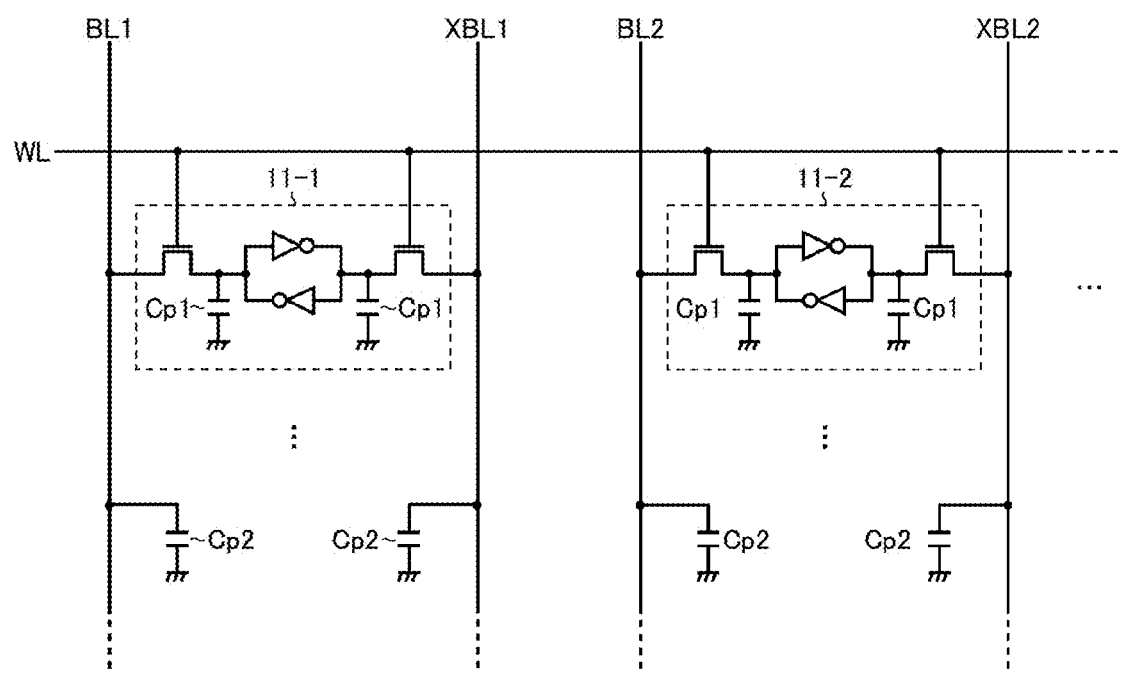
FIG. 4 is a diagram illustrating necessity for bit line precharging in SRAM.

FIG. 4 is a diagram illustrating the necessity for bit line precharging in an SRAM memory cell having a 6T structure. As shown there, a plurality of SRAM memory cells 11-1 and 11-2 belonging to the same row are all connected to a single word line WL. On the other hand, a plurality of SRAM memory cells 11-1 and 11-2 belonging to different columns are respectively connected to corresponding bit lines BL1 and BL2 and to corresponding inverted bit lines XBL1 and XBL2.

In a read/write operation in the SRAM memory cell 11-1, the word line WL is raised to high level. As a result, the SRAM memory cell 11-1 that is a target of the read/write operation becomes connected to the corresponding bit line BL1 and inverted bit line XBL1. Here, the word line WL is connected also to the SRAM memory cell 11-2 that is not a target of the read/write operation. Accordingly, when the word line WL is raised to high level, the SRAM memory cell 11-2 that is not a target of the read/write operation also becomes connected to the corresponding bit line BL2 and inverted bit line XBL2.

Here, the internal nodes in the SRAM memory cells 11-1 and 11-2 are accompanied by a parasitic capacitor Cp1 with a very low capacitance. By contrast, laid over a very large wiring length, the bit line BL and the inverted bit line XBL are accompanied by a parasitic capacitor Cp2 with a higher capacitance.

Thus, when, in a read/write operation in the SRAM memory cell 11-1, the word line WL is raised to high level, if the bit line BL2 and inverted bit line XBL2 connected to the SRAM memory cell 11-2 have not been precharged (i.e., if the parasitic capacitor Cp2 has not been charged), electric charge redistribution between the parasitic capacitors Cp1 and Cp2 may cause data corruption in the SRAM memory cell 11-2.

To prevent such data corruption, in conventional operation, before the word line WL is raised to high level, a predetermined voltage (VDD or VDD/2) is applied to the bit line BL2 and inverted bit line XBL2 connected to the SRAM memory cell 11-2 that is not a target of the read/write operation, so that the parasitic capacitor Cp2 is charged previously. This is called a bit line precharge method.

By contrast, in the memory cell 11 (ferroelectric shadow memory) shown in FIG. 2, to the internal nodes Node1 and Node2 are connected the ferroelectric capacitors FC1 to FC4 which have a far higher capacitance than the parasitic capacitor Cp2. Thus, when the word line WL is raised to high level, even if the bit line BL and inverted bit line XBL are not precharged, electric charge redistribution between the parasitic capacitor Cp2 and the ferroelectric capacitors FC1 to FC4 causes only slight voltage variations at the internal nodes Node1 and Node2.

However, conventionally, even in the operation of ferroelectric shadow memory, since it is based on SRAM memory cells, a method for driving these has been followed, and bit line precharging is performed rather routinely.

Suspicious of the significance of such bit line precharging, the present inventors have, through intensive studies, found out that the ferroelectric capacitors FC1 to FC4, which are provided chiefly for the purpose of making data nonvolatile, can also contribute to prevention of data corruption in the memory cell 11 during an active period, and have come to a conclusion that no bit line precharging is necessary in the operation of ferroelectric shadow memory.

Figure 5:
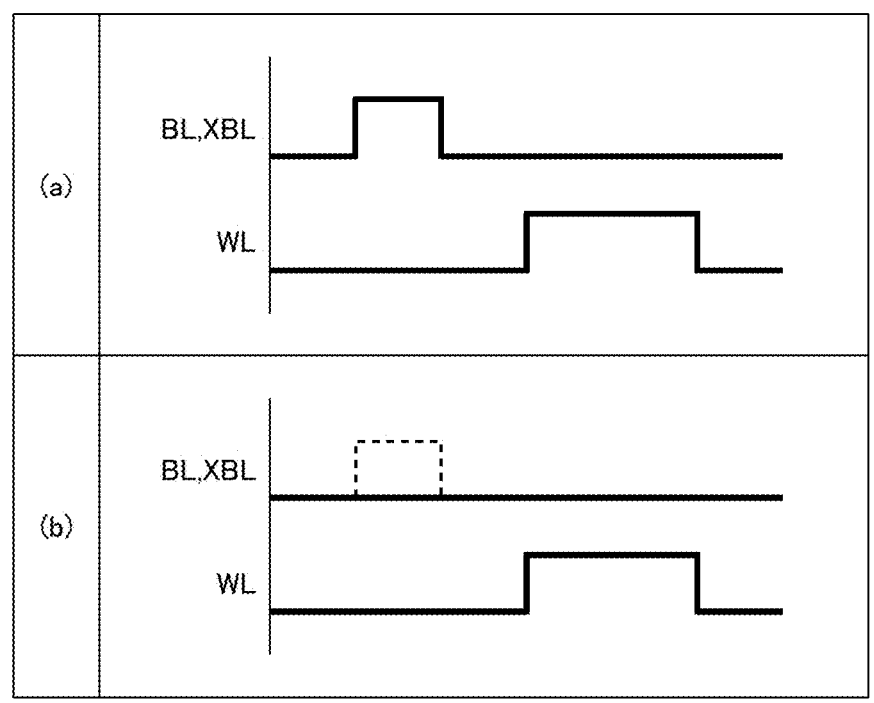
FIG. 5 is a diagram showing a bit line non-precharge method in ferroelectric shadow memory.

FIG. 5 is a diagram showing a bit line non-precharge method in ferroelectric shadow memory. As shown in column (a), in the operation of an SRAM memory cell, before the word line WL is raised to high level, the bit line BL and inverted bit line XBL are precharged. By contrast, as shown in column (b), in the operation of ferroelectric shadow memory, based on the above-mentioned finding, the word line WL can be raised to high level with no precharging of the bit line BL and inverted bit line XBL.

Specifically, in a semiconductor memory device 100 that adopts ferroelectric shadow memory as memory cells 11, it is preferable to program the operation sequence of the memory controller 2 such that, when accessing a memory cell that is a target of a read/write operation, it drives the word line WL to turn on the transistors M5 and M6 without precharging the bit line BL and inverted bit line XBL connected to a memory cell that is not a target of the read/write operation.

Moreover, in a case where the bit line non-precharge method is adopted, it is preferable to provide an equalizer for making the potentials on a bit line BL and an inverted bit line XBL in a pair equal.

Figure 6:
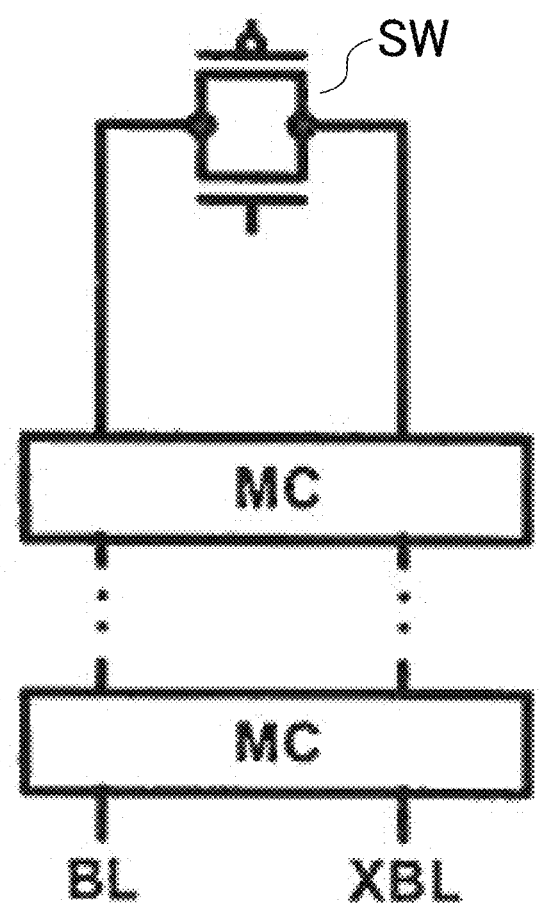
FIG. 6 is a diagram showing one example of configuration for realizing BL/XBL equalizing.

FIG. 6 is a diagram showing one example of configuration for achieving equalizing between a bit line BL and an inverted bit line XBL. In this configuration example, a transmission gate SW is connected between a bit line BL and an inverted bit line XBL in a pair. Though not expressly shown in the figure, transmission gates SW are provided one for each pair comprising one each of a plurality of bit lines BL and a plurality of inverted bit lines XBL provided.

The transmission gate SW is turned on and off by the memory controller 2. More specifically, when accessing a memory cell that is a target of a read/write operation, the memory controller 2 turns on a transmission gate SW between a bit line BL and an inverted bit line XBL that are connected to a memory cell that is not a target of the read/write operation.

By turning on the transmission gate SW, it is possible to short-circuit together the bit line BL and inverted bit line XBL connected to the memory cell that is not a target of the read/write operation, and thereby to make the potentials on them equal. Thus, it is possible to avoid the worst case in which data in the memory cell 11 corrupts (e.g., a situation where high level is applied to the low level-side internal node and low level is applied to the high level-side internal node), and thus to more reliably prevent data corruption in the memory cell 11.

As described above, the semiconductor memory device 100 proposed in the first embodiment omits bit line precharging in a read/write operation by use of the high-capacity ferroelectric capacitors FC1 to FC4 connected to the internal nodes Node1 and Node2 in the memory cell 11, and thus operates only with equalizing by use of a transmission gate SW. By adopting this configuration, it is possible to greatly reduce the electric power consumption during a read/write operation.

Figure 7:
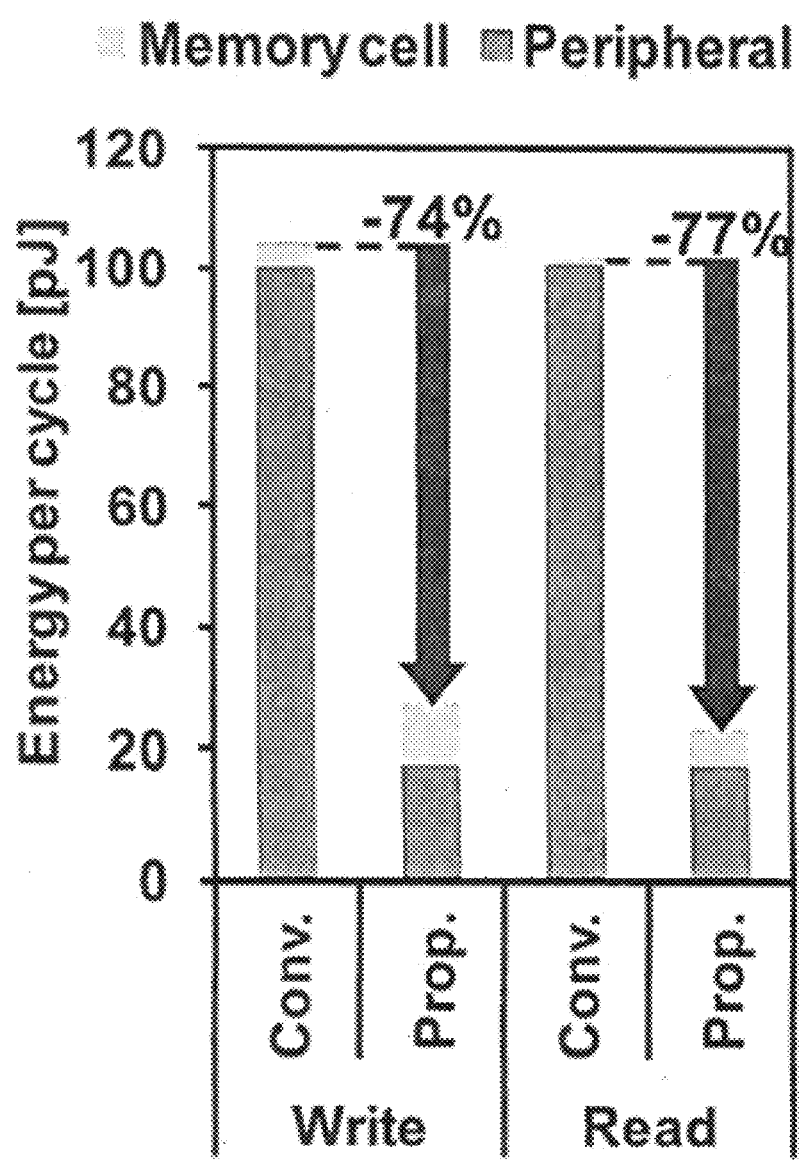
FIG. 7 is a diagram showing usefulness of a bit line non-precharge method.

FIG. 7 is a diagram showing the usefulness of the bit line non-precharge method. As shown there, by adopting the bit line non-precharge method, it is possible to reduce the electric power consumption during a write operation by 74% from the conventional level, and to reduce the electric power consumption during a read operation by 77% from the conventional level.

Also, for its high-speed operation, the equalizing method involving short-circuiting between a bit line BL and an inverted bit line XBL with a transmission gate SW is superior to the conventional bit line precharge method.

Figure 8:
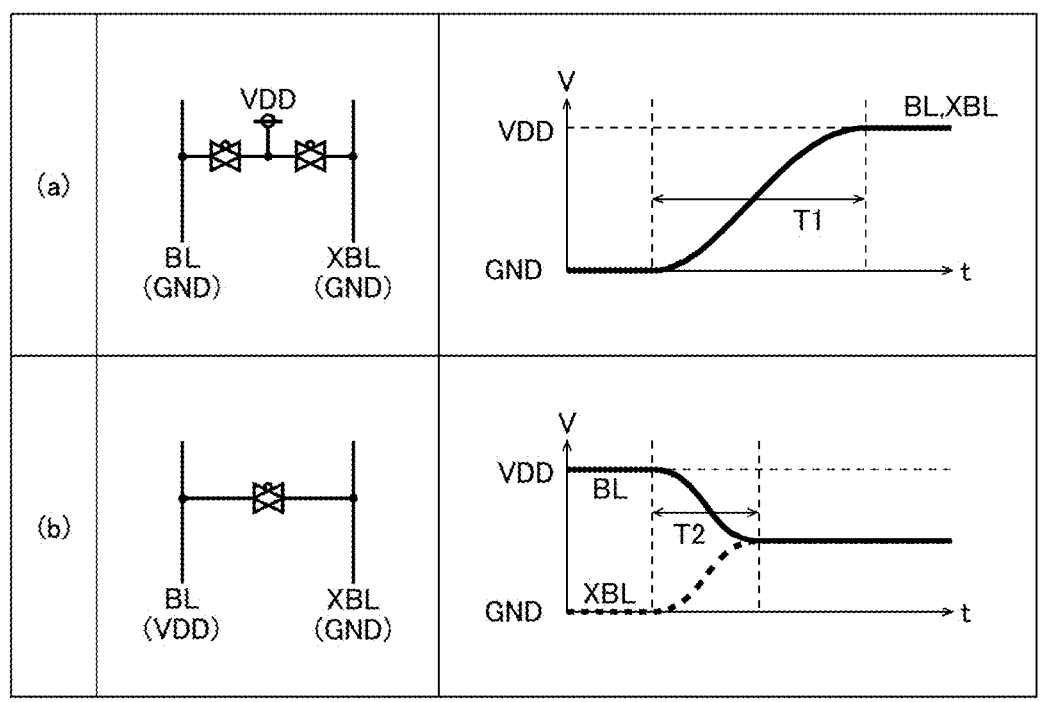
FIG. 8 is a diagram showing advantage of BL/XBL short-circuiting.

FIG. 8 is a diagram showing the advantage of the equalizing method described above. As shown in column (a) there, in a case where a bit line BL and an inverted bit line XBL are precharged with the supply voltage VDD, in the worst case (BL=XBL=GND), it takes time T1 for the bit line BL and inverted bit line XBL to reach the supply voltage VDD. This requires that the bit line precharging time be set equal to or longer than the time T1.

By contrast, as shown in column (b) in FIG. 8, in a case where a bit line BL and an inverted bit line XBL are short-circuited together, the time it takes for the potentials on the bit line BL and inverted bit line XBL to become equal is, even in the worst case (BL=VDD, XBL=GND), shorter than the above-mentioned time T1. Thus, it is possible to quickly complete equalizing and raise the word line WL to high level, and hence to shorten the read/write time. Shortening the read/write time leads to shortening active periods (lengthening sleep periods), and thus also contributes to power saving in the entire system.

Moreover, adopting the bit line non-precharge method also contributes to increased capacity of the semiconductor memory device 100. Conventionally, for a read/write operation in a given memory cell, all the bit lines BL and inverted bit lines XBL connected to each memory cell other than the one that is a target of the read/write operation are precharged. Thus, with consideration given to the electric power required for bit line precharging, there is inherently an upper limit on the number of memory cells 11 connected to one word line WL (and hence the wiring length of the word line WL). Moreover, the longer the wiring length of the bit line and the inverted bit line XBL, the higher the capacitance of the parasitic capacitor Cp2 that accompanies them, and thus the higher the electric power required for precharging. Thus, there is inherently an upper limit also on the wiring length of the bit line and the inverted bit line XBL.

On the other hand, adopting the bit line non-precharge method makes it possible to make the memory cell array 10 larger (make the word line WL, or the bit line BL and inverted bit line XBL, longer) with no consideration given to precharging electric power. Thus, it is possible to increase the proportion of the area of the memory cell array 10 in the entire memory block 1 (the ratio of the area of the memory cell array 10 to that of the peripheral circuits 20 to 70). It is thus possible to increase the storage capacity (storage density per unit time) of the semiconductor memory device 100 without unduly increasing its device size).

Although the above description deals with an example where the bit line non-precharge method is applied to a ferroelectric shadow memory, this is not meant to limit the target of its application. The bit line non-precharge method described above can suitably be applied to any memory based on SRAM memory cells having a 6T structure wherein internal nodes are connected to node capacitors having a higher capacitance than the parasitic capacitor Cp2. That is, node capacitors that can contribute to the holding of data in a memory cell 11 are not limited to ferroelectric capacitors FC1 to FC4 connected to plate lines PL1 and PL2.

Second Embodiment

Next, a description will be given of a plate line charge share method in which electric charge is shared between plate lines PL1 and PL2 that are sequentially driven in a store/recall operation.

Figure 9:
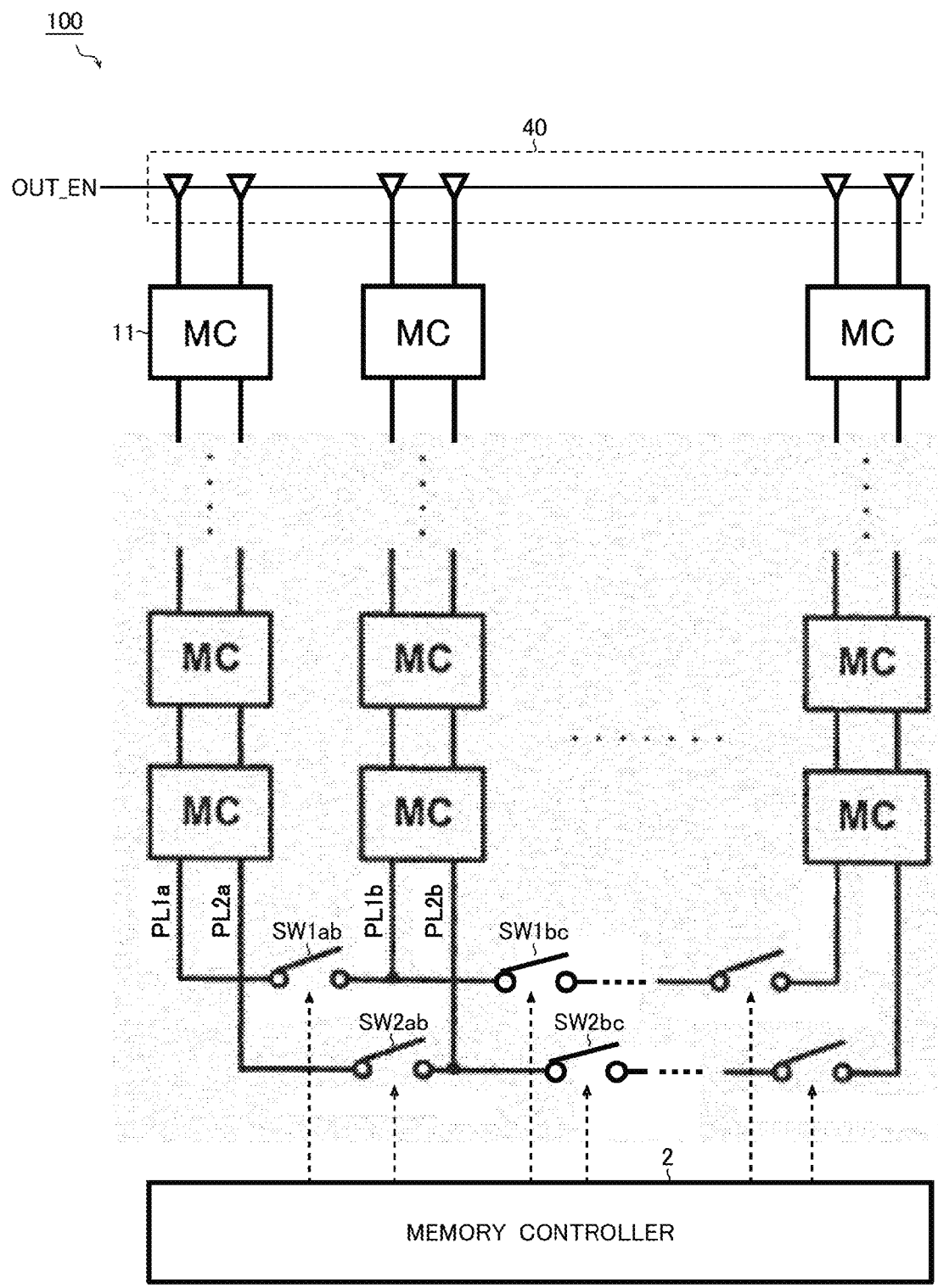
FIG. 9 is a diagram showing one example of configuration for realizing plate line charge sharing.

FIG. 9 is a diagram showing one example of configuration for achieving the plate line charge share method. The semiconductor memory device 100 of this configuration example includes, as described previously, a plurality of memory cells 11 arrayed in a matrix, plate lines PL1(*a, b, . . .* ) and PL2(*a, b, . . .* ) connected to the plurality of memory cells 11 respectively, a plate line driver 40 for driving the plate lines PL1(*a, b, . . .* ) and PL2(*a, b, . . .* )

individually, and a memory controller 2 for controlling access to the plurality of memory cells 11.

The semiconductor memory device 100 of this configuration example further includes a plurality of transmission gates SW1(ab, bc, ... ) and SW2(ab, bc, ... ) commented between adjacent plate lines. Specifically, a transmission gate SW1ab is connected between plate lines PL1a and PL1b, and a transmission gate SW1bc is connected between plate lines PL1b and PL1c (the latter unillustrated). Likewise, a transmission gate SW2ab is connected between plate lines PL2a and PL2b, and a transmission gate SW2bc is connected between plate lines PL2b and PL2c (the latter unillustrated).

When restoring/recalling data in the memory cell 11, the memory controller 2 pulse-drives the plate lines PL1(a, b, ... ) and PL2(a, b, ... ) sequentially by use of the plate line driver 40.

Meanwhile, the memory controller 2 so controls that, before an uncharged plate line is pulse-driven by the plate line driver 40, charge sharing takes place between a charged and an uncharged plate line. More specifically, the memory controller 2 so controls that, before an uncharged plate line is pulse-driven by the plate line driver 40, a transmission gate between a charged and an uncharged plate line is turned on and thereby these plate lines are short-circuited together.

Figure 10:
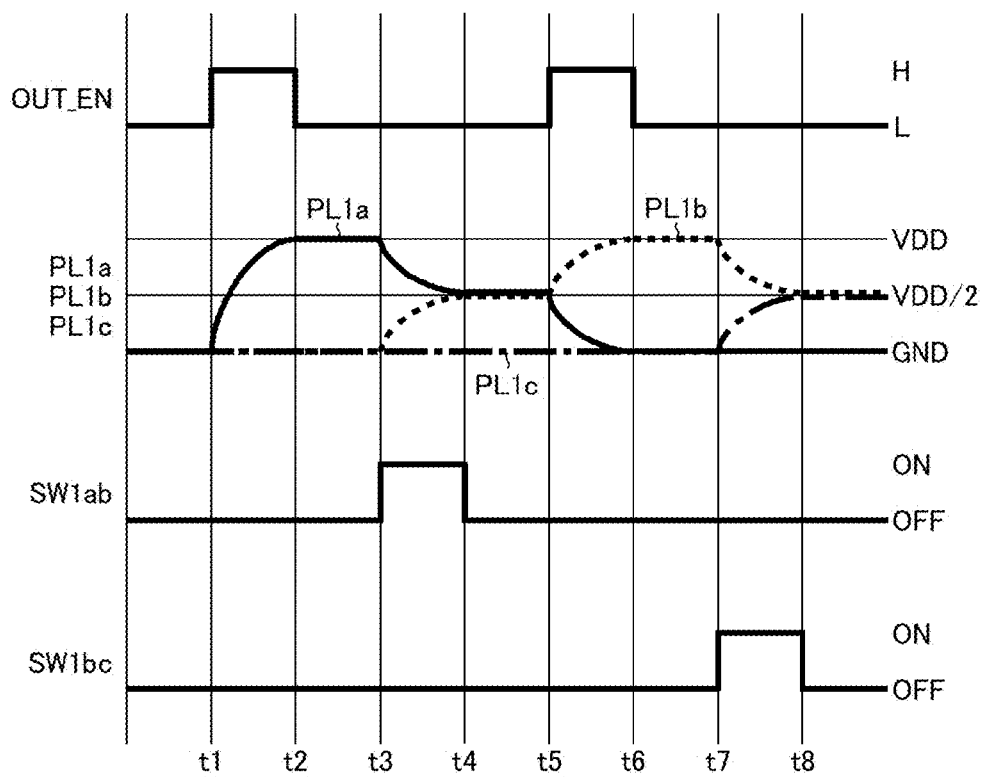
FIG. 10 is a timing chart showing one example of operation for plate line charge sharing.

FIG. 10 is a timing chart illustrating one example of operation for plate line charge sharing, and shows, from top down, an output enable signal OUT_EN from the plate line driver 40, the voltages applied to the plate lines PL1(a, b, c), and the on/off states of the transmission gates SW1(ab, bc). The plate line PL2(a, b, ... ) and the transmission gate SW2(a, b, ... ) are controlled so as to behave in a similar manner to the plate line PL1(a, b, ... ) and the transmission gate SW1(a, b, ... ), and are therefore omitted from illustration here.

When, at time point t1, the output enable signal OUT_EN from the plate line driver 40 is raised to high level (the logic level with output enabled), the plate line PL1a is charged up to the supply voltage VDD.

When, at time point t2, the output enable signal OUT_EN from the plate line driver 40 is lowered to low level, the plate line PL1a is brought into a floating state. Thus, the plate line PL1a is kept substantially at the supply voltage VDD after time point t2.

When, at time point t3, the transmission gate SW1ab is turned on, the path between the charged plate line PL1a and the uncharged plate line PL1b conducts, and thus charge sharing (charge redistribution) takes place until the voltages on them are equal (=VDD/2).

When, at time point t4, the transmission gate SW1ab is turned off, the path between the plate lines PL1a and PL1b is cut off. The plate lines PL1a and PL1b are kept substantially at an equal voltage (=VDD/2) after time point t4.

When, at time point t5, the output enable signal OUT_EN from the plate line driver 40 is raised to high level (the logic level with output enabled), whereas the plate line PL1b is charged up to the supply voltage VDD, the plate line PL1a is discharged down to a ground voltage GND. Here, the plate line PL1b has already been charged up to VDD/2; thus the electric power that needs to be supplied from the plate line driver 40 is less than (ideally one-half of) the electric power required for initial charging.

After time point t6, charge sharing between a charged and an uncharged plate line continues in a similar manner as described above.

The floating periods between time points t2 and t3, between time points t4 and t5, and between time points t6 and t7 can be shortened or omitted as necessary.

As described above, by adopting the plate line charge share method, unlike the conventional method involving individual charging of a plurality of plate lines, it is possible, instead of discarding all the electric charge stored in previous plate line charging, to exploit part of it in subsequent plate line charging. It is thus possible to greatly reduce (ideally down to approximately one-half) the electric power consumption by the plate line driver 40.

Although FIG. 10 deals with an example where plate lines are driven sequentially, one at the time, a configuration is also possible where plate lines are driven a plurality of them at a time, in a plurality of steps. However, the larger the number of plate lines that are driven simultaneously, the higher the peak value of the drive current, and also the higher the electric power required in initial charging. Thus, the number of plate lines that are driven simultaneously can be designed with consideration given to a tradeoff between speed and required electric power.

Figure 11:
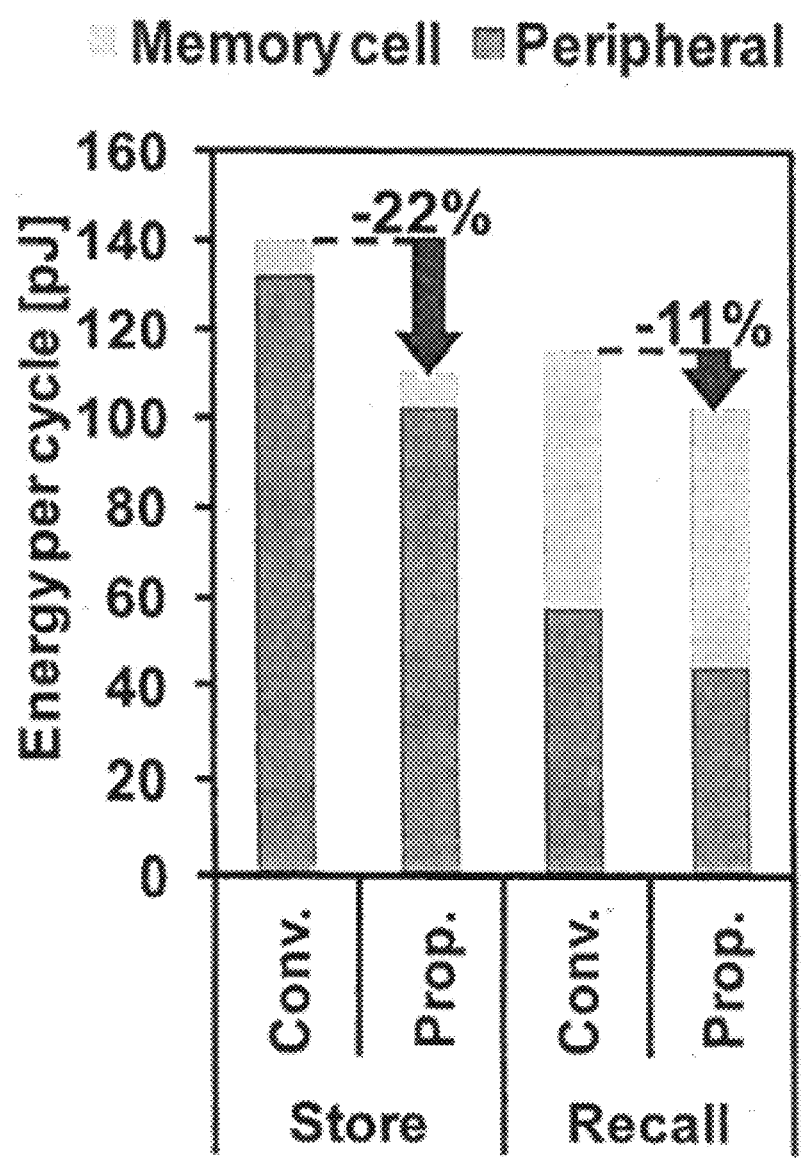
FIG. 11 is a diagram showing usefulness of a plate line charge share method.

FIG. 11 is a diagram showing the usefulness of the plate line charge share method. As shown there, by adopting the plate line charge share method, it is possible to reduce the electric power consumption during a store operation by 22% relative to the conventional level, and to reduce the electric power consumption during a recall operation by 11% relative to the conventional level.

Third Embodiment

As shown in FIG. 2 previously referred to, in a ferroelectric shadow memory having a 6T-4C structure, internal nodes Node1 and Node2 are connected to ferroelectric capacitors FC1 to FC4 with a high capacitance. Thus, with a ferroelectric shadow memory, data writing during an active period requires longer time than with an SRAM having a 6T structure. As a solution to this problem, a description will be given below of a word line boost method in which the potential on a word line WL is raised in a write operation.

Figure 12:
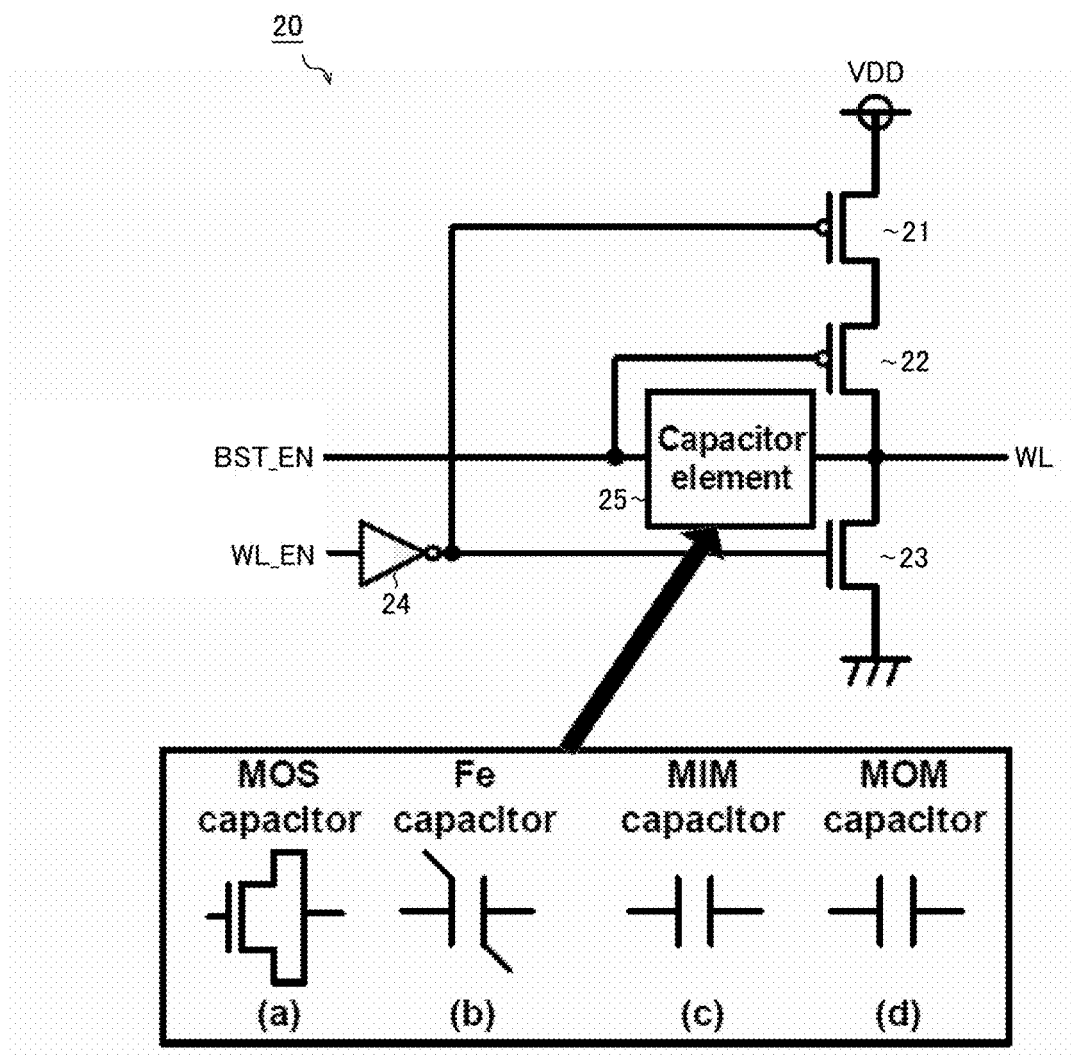
FIG. 12 is a circuit diagram showing one example of configuration of a word line driver 20.

FIG. 12 is a circuit diagram showing one example of the configuration of the word line driver 20. The word line driver 20 of this configuration example includes P-channel type field-effect transistors 21 and 22, an N-channel type field-effect transistor 23, an inverter 24, and a capacitor element 25.

The source of the transistor 21 is connected to a supply voltage node. The drain of the transistor 21 is connected to the source of the transistor 22. The drains of the transistors 22 and 23 are both connected to a word line WL. The source of the transistor 23 is connected to a ground node. The gates of the transistors 21 and 23 are both connected to the output terminal of the inverter 24. The input terminal of the inverter 24 is connected to a node to which a word line enable signal WL_EN is applied. The gate of the transistor 22 is connected to a node to which a boost enable signal BST_EN is applied. The capacitor element 25 is connected between the node to which the word line enable signal WL_EN is applied and the node to which the boost enable signal BST_EN is applied.

The transistors 21 and 23 and the inverter 24 function as an output stage which drives the word line WL of a memory cell 11 according to the word line enable signal WL_EN. The transistor 22 and the capacitor element 25 function as a boost stage which drives the capacitor element 25 (controls its coupling or connection so as to perform charge pumping) according to the boost enable signal BST_EN so as to raise the voltage applied to the word line WL to higher than the supply voltage VDD in the output stage.

Conventionally, it is common to use, as the capacitor element 25 provided in the boost stage, (a) a MOS (metal-oxide-semiconductor) capacitor, (c) a MIM (metal-insulator-metal) capacitor, or (d) a MOM (metal-oxide-metal) capacitor. By contrast, in the word line driver 20 of this configuration example, as the capacitor element 25, (b) a ferroelectric capacitor (Fe capacitor) is used.

FIG. 13 is a table of comparison of areas of different types of capacitor (the areas of a word line driver 20 and of a 16-Kbit memory block 1 using each type of capacitor with the same capacitance). As shown there, for a given capacitance, a ferroelectric capacitor has a smaller area than the other types of capacitor. Accordingly, by using a ferroelectric capacitor as the capacitor element 25, it is possible to achieve word line boosting without unduly increasing the circuit area of the word line driver 20 (and hence of the memory block 1).

For the capacitor element 25 provided in the boost stage, capacitance linearity is not very important, and thus a ferroelectric capacitor can be used there without problem despite a high polarizing property. Moreover, a ferroelectric shadow memory inherently incorporates ferroelectric capacitors to achieve nonvolatility, and therefore adopting a ferroelectric capacitor as the capacitor element 25 does not change in any way the manufacturing process of the semiconductor memory device 100.

Figure 14:
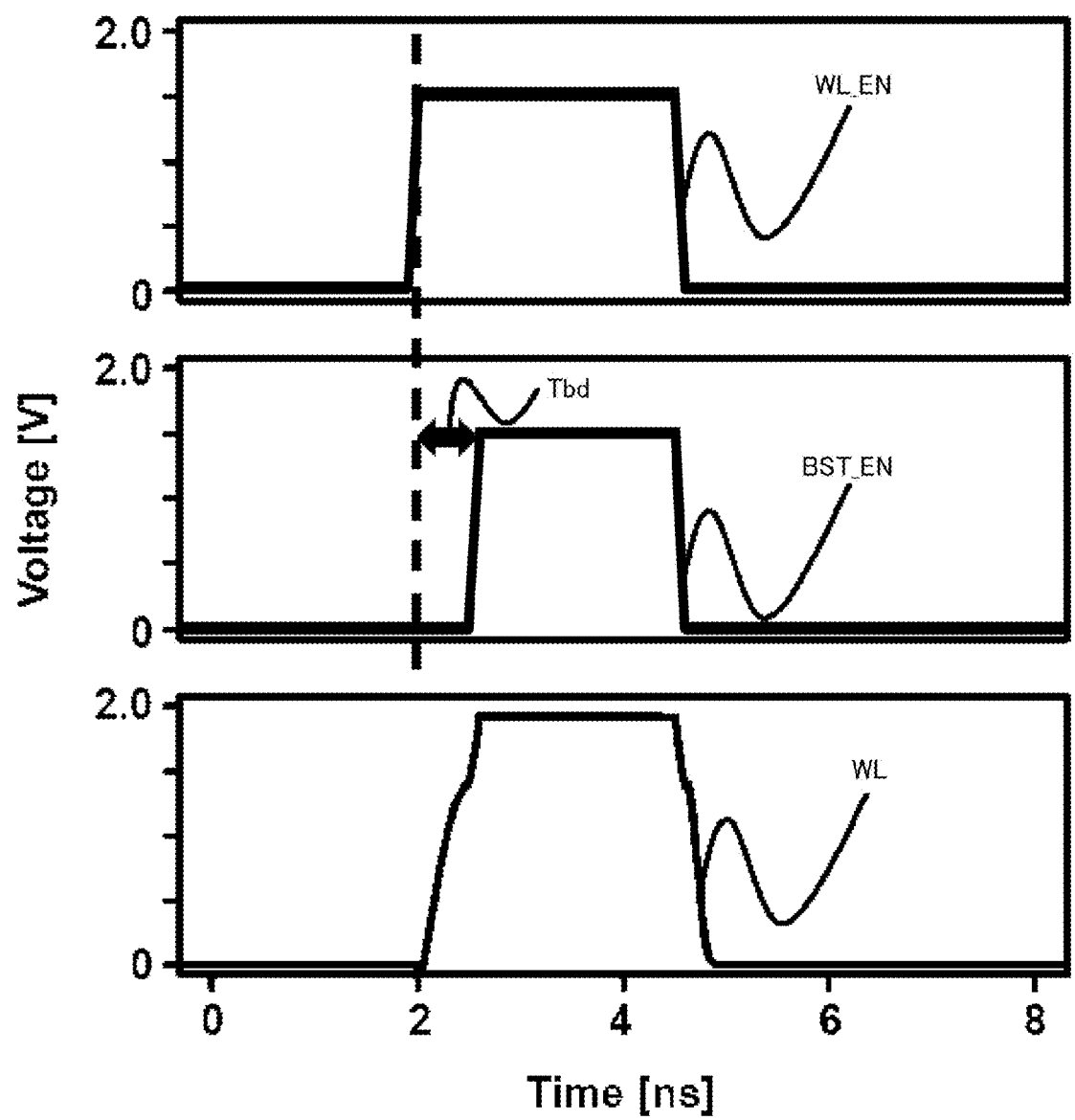
FIG. 14 is a timing chart showing one example of operation for word line boosting.

FIG. 14 is a timing chart illustrating one example of operation for word line boosting, showing, from top down, the word line enable signal WL_EN, the boost enable signal BST_EN, and the voltage applied to the word line WL.

In a write operation in the memory cell 11, first, the word line enable signal WL_EN is raised to high level, so that the voltage applied to the word line WL gradually increases. At this point, the boost enable signal BST_EN is kept at low level. Accordingly, a voltage difference appears across the capacitor element 25, and thus the capacitor element 25 is charged.

At the lapse of a predetermined delay time (boost delay) after the word line enable signal WL_EN is raised to high level, the boost enable signal BST_EN is raised to high level (e.g., VDD=1.8 V). At this point, electric charge has been charged across the capacitor element 25 (ferroelectric capacitor), and thus according to the principle of charge conservation, the word line WL is raised up to (Supply Voltage VDD)+α (e.g., 1.8 V+α).

As a result, the access transistors M5 and M6 provided in the memory cell 11 exhibit higher conductivity than when the supply voltage VDD is applied to the word line WL (without a boost). Thus, it is possible to shorten the time required for data writing during an active period without unduly increasing the driving capacity of the write circuit 60.

Figure 15:
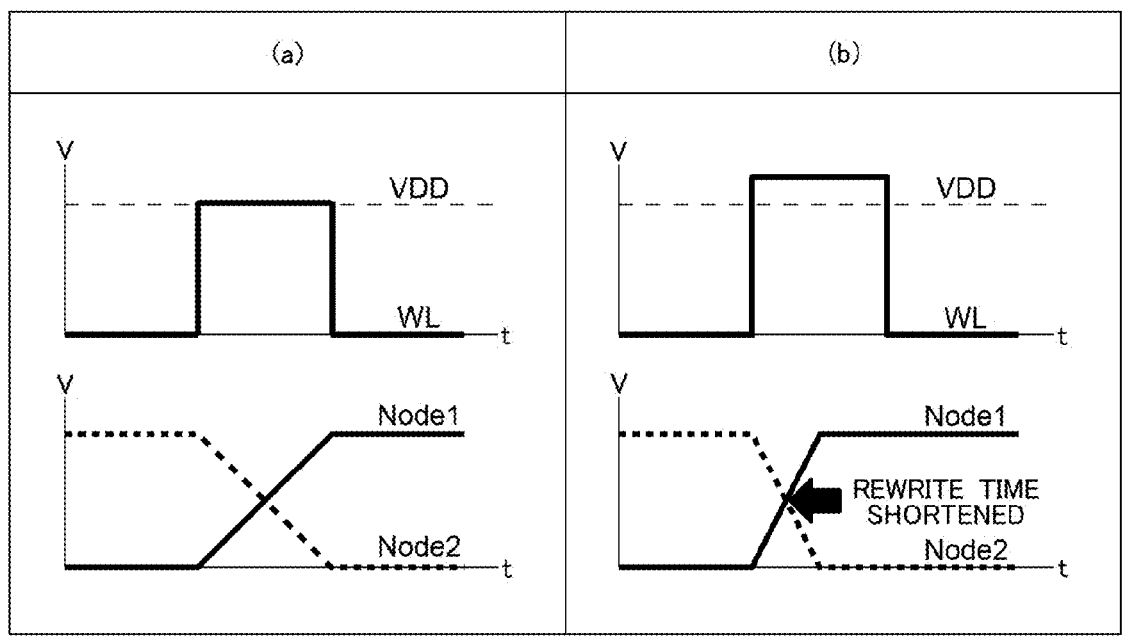
FIG. 15 is a diagram showing usefulness of a word line boost method.

FIG. 15 is a diagram illustrating the usefulness of the word line boost method. In column (a) is shown behavior without a word line boost, and in column (b) is shown behavior with a word line boost. As will be understood from comparison between columns (a) and (b), by adopting a word line boost, it is possible to shorten the time for data rewriting, that is, the time until the voltages applied to the internal nodes Node1 and Node2 cross each other in a write operation.

Figure 16:
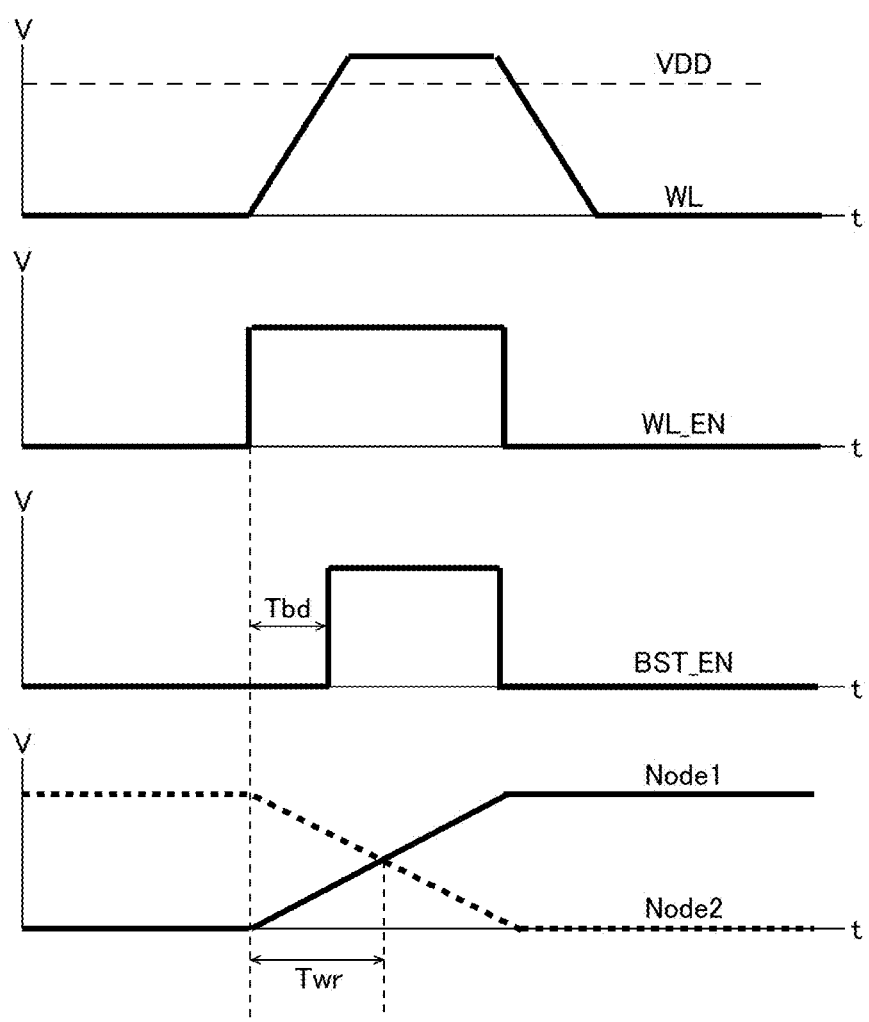
FIG. 16 is a diagram illustrating optimization of a boost delay.

FIG. 16 is a diagram illustrating optimization of the boost delay. In the following description, the delay time after the word line enable signal WL_EN is raised to high level until the boost enable signal BST_EN is raised to high level is referred to as boost delay Tbd. The time after the word line enable signal WL_EN is raised to high level until the voltages applied to the internal nodes Node1 and Node2 cross each other is referred to as data rewriting time Twr. The boost delay that minimizes the data rewriting time Twr is referred to as ideal boost delay T0.

Figure 17:
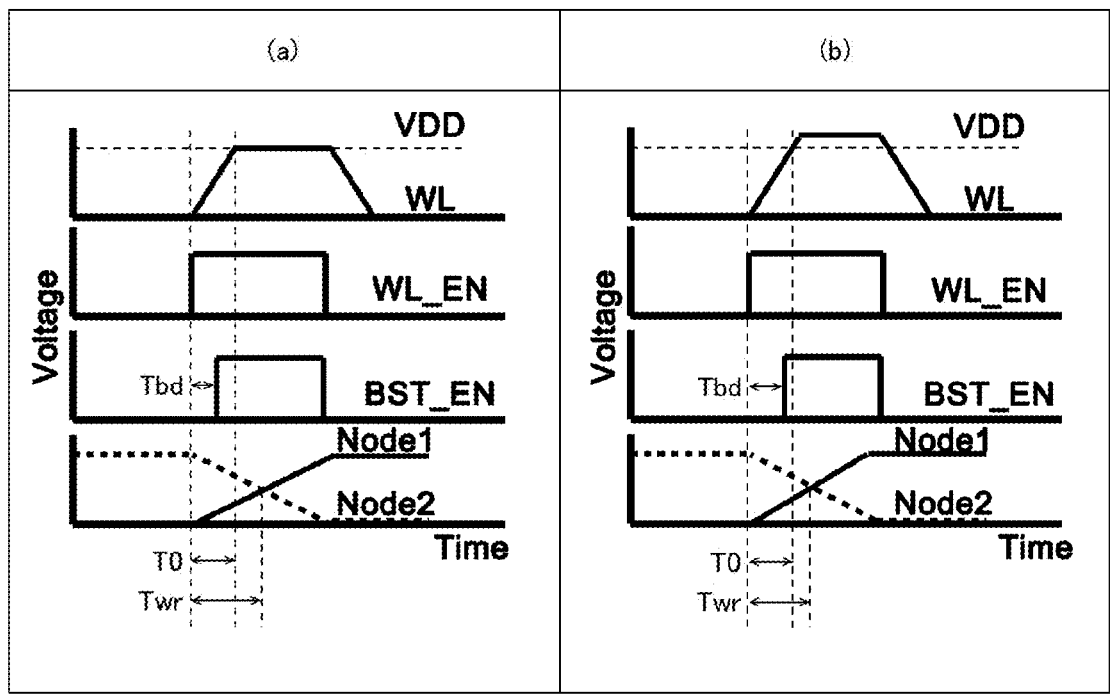
FIG. 17 is a diagram showing how Twr varies as Tbd is extended (Tbd<T0)
Figure 18:
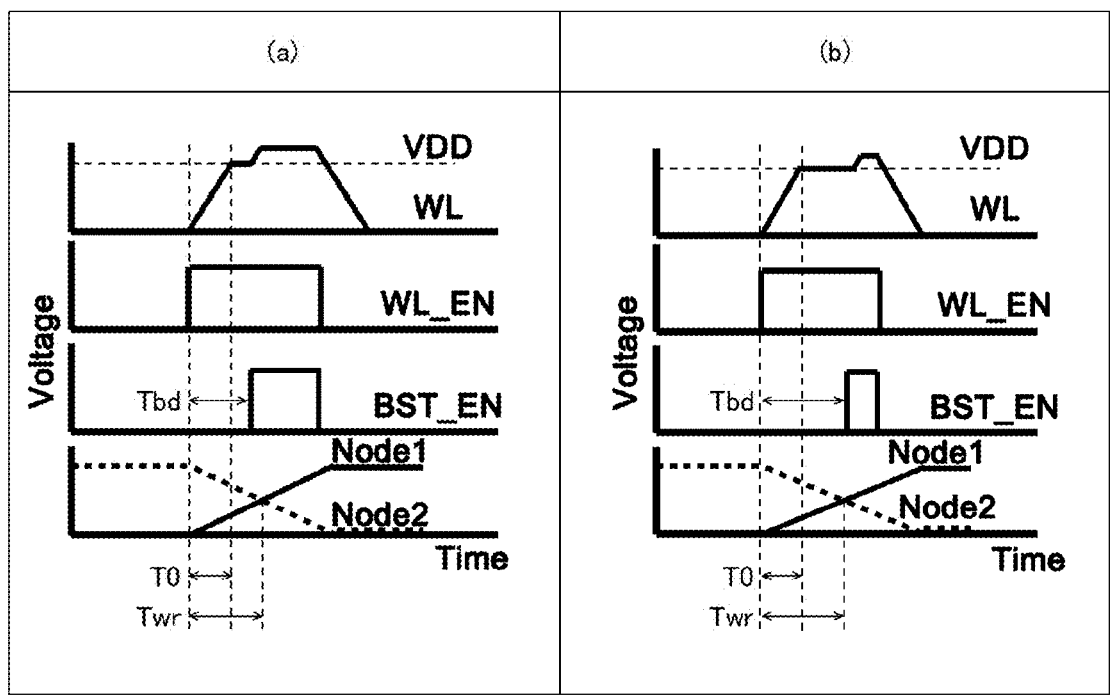
FIG. 18 is a diagram showing how Twr varies as Tbd is extended (Tbd>T0)

FIGS. 17 and 18 are diagrams showing how the data rewriting time Twr varies as the boost delay Tbd is extended. FIG. 17 shows a case where the boost delay Tbd is shorter than the ideal boost delay T0 (Tbd<T0), and FIG. 18 shows a case where the boost delay Tbd is longer than the ideal boost delay T0 (Tbd>T0).

As shown in FIG. 17, in the region Tbd<T0, the more the boost delay Tbd is extended and thus the closer it is brought to the ideal boost delay T0, the higher the potential on the word line WL after the voltage raising.

On the other hand, as shown in FIG. 18, in the region Tbd>T0, the more the boost delay Tbd is extended and thus the farther it is deviated from the ideal boost delay T0, the shorter the time of the voltage raising on the word line WL, resulting in a smaller effect of improving the data rewriting time Twr.

Figure 19:
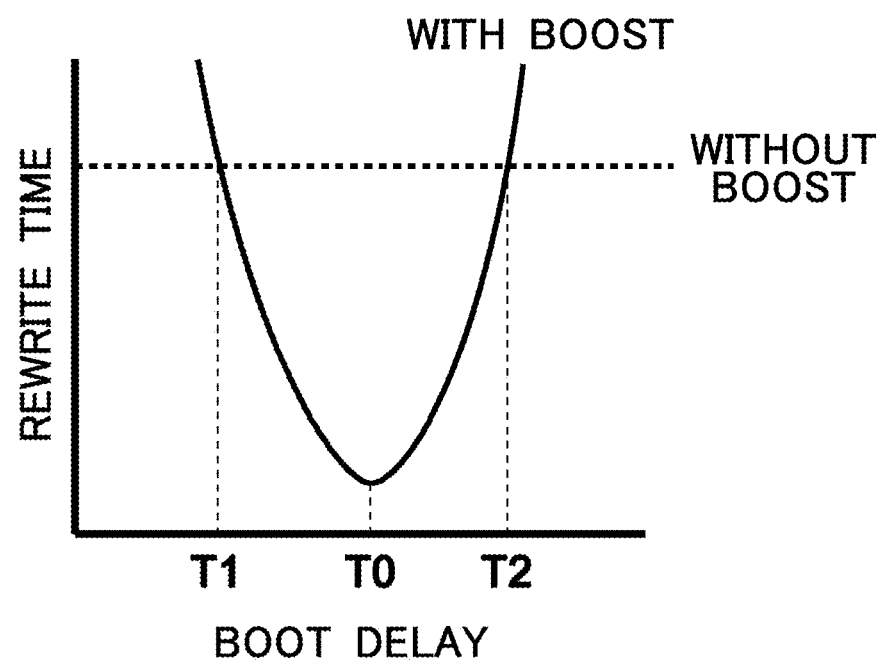
FIG. 19 is a diagram showing a correlation between boost delay Tbd and data rewriting time Twr.

FIG. 19 is a diagram showing a correlation between the boost delay Tbd and the data rewriting time Twr. As shown there, the data rewriting time Twr is the shortest when the boost delay Tbd is equal to the ideal boost delay T0, and is the longer the farther the boost delay Tbd is deviated from the ideal boost delay T0. In the following description, the boost delay Tbd that is so short as to result in the same data rewriting time Twr as without a boost is referred to as lower-limit boost delay T1. On the other hand, the boost delay Tbd that is so long as to result in the same data rewriting time Twr as without a boost is referred to as upper-limit boost delay T2.

Figure 20:
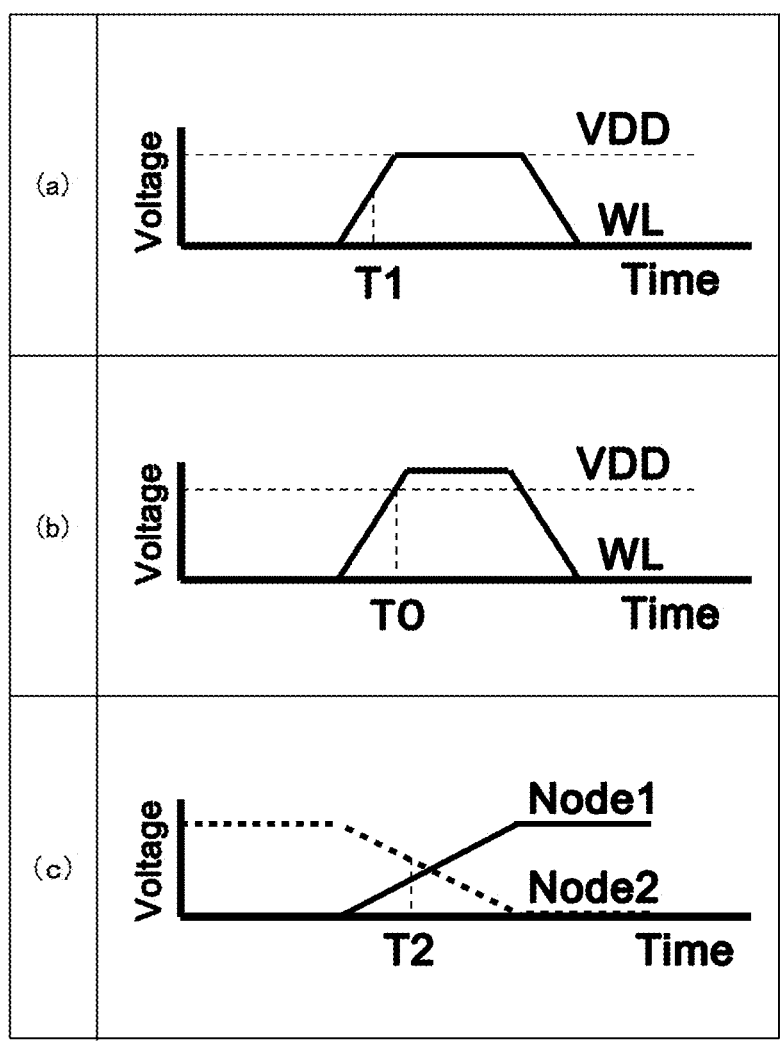
FIG. 20 is a diagram illustrating factors determining T1, T2, and T0.

FIG. 20 is a diagram illustrating the factors that determine the lower-limit boost delay T1, the upper-limit boost delay T2, and the ideal boost delay T0.

As shown in columns (a) and (b) in FIG. 20, the lower-limit boost delay T1 and the ideal boost delay T0 are determined based on how far the voltage applied to the word line WL has risen at the time point that the boost enable signal BST_EN is raised to high level. On the other hand, as shown in column (c) there, the upper-limit boost delay T2 is determined based on how far the potential difference between the internal nodes Node1 and Node2 has lessened at the time point that the boost enable signal BST_EN is raised to high level.

Figure 21:
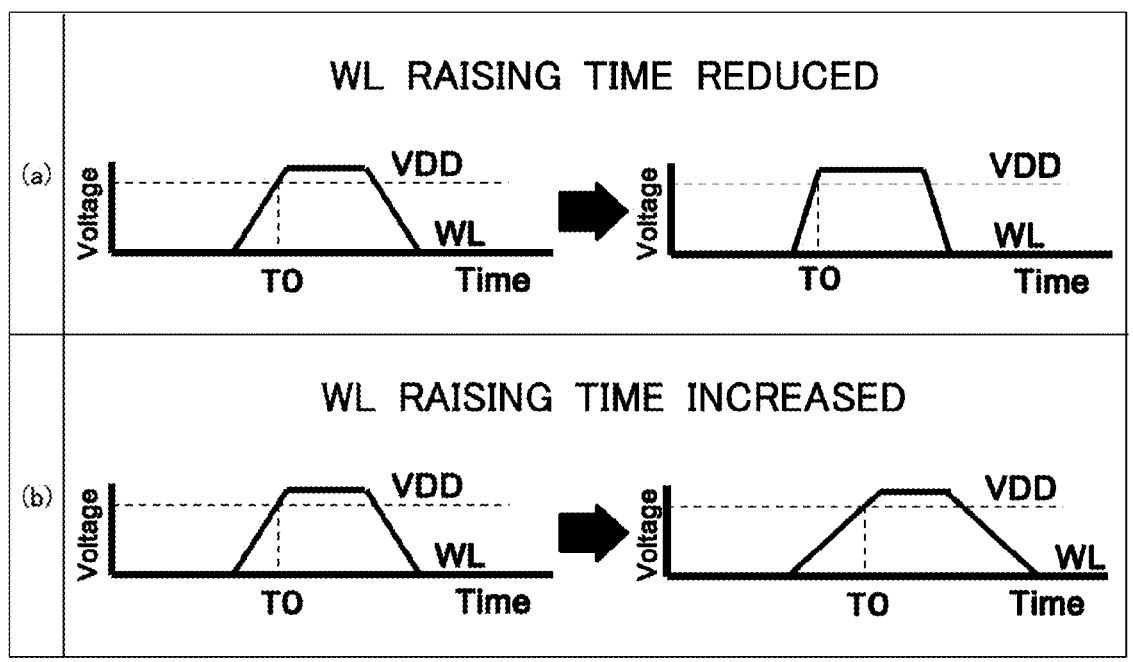
FIG. 21 is a diagram showing how T0 varies with WL raising time.

FIG. 21 is a diagram showing how the ideal boost delay T0 varies with the duration of voltage raising on the word line WL (word line WL raising time).

Due to production variations among the transistors provided in the semiconductor memory device 100 (in particular, the word line driver 20), the word line WL raising time and the data writing time vary. Accordingly, the lower-limit boost delay T1, the upper-limit boost delay T2, and the ideal boost delay T0 also vary due to production variations among the transistors.

For example, as shown in column (a) in FIG. 21, the shorter the word line WL raising time, the shorter the ideal boost delay T0. In contrast, as shown in column (b) there, the longer the word line WL raising time, the longer the ideal boost delay T0.

As described above, the ideal boost delay T0 varies with the word line WL raising time. Accordingly, to obtain a maximum effect of improving the data rewriting time Twr by the word line boost method, it is necessary to generate the boost delay Tbd according to variation in the ideal boost delay T0.

Figure 22:
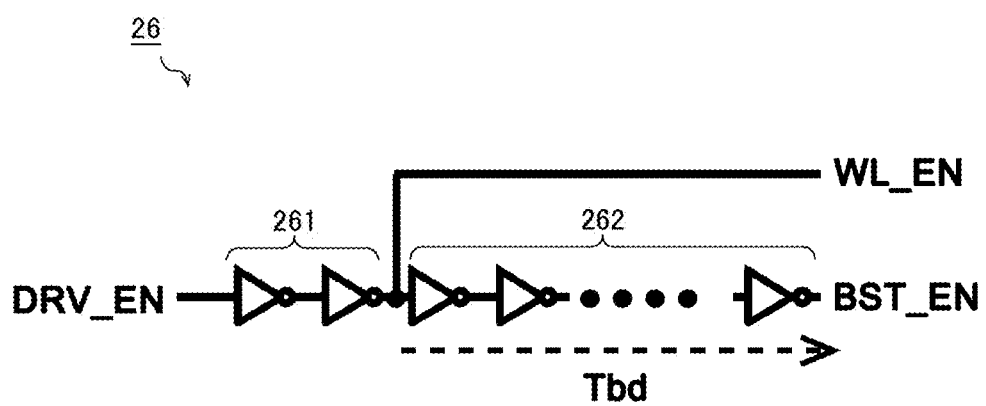
FIG. 22 is a circuit diagram showing one example of configuration of a delay stage 26.

FIG. 22 is a circuit diagram showing one example of the configuration of the delay stage 26. The delay stage 26 of this configuration example is incorporated as a stage preceding the word line driver 20, and generates the boost enable signal BST_EN by delaying the word line enable signal WL_EN by the boost delay Tbd.

More specifically, the delay stage 26 includes an x-stage inverter chain 261, which generates the word line enable signal WL_EN by giving a predetermined delay to a reference enable signal DRV_EN, and a y-stage inverter chain 262, which generates the boost enable signal BST_EN by delaying the word line enable signal WL_EN by the boost delay Tbd.

Incidentally, the transistors provided in the inverter chains 261 and 262 respectively are all formed by the same process by which the other transistors provided in the word line driver 20 are formed. Accordingly, even when there are production variations among the transistors, the characteristics of the word line driver 20 and of the delay stage 26 vary in the same way.

More specifically, when production variations among the transistors are such that the word line driver 20 has higher driving capacity, the word line WL raising time is shorter, and the ideal boost delay T0 is also shorter (see FIG. 21, column (a) referred to previously). Here, the inverter chain 262 has accordingly higher driving capacity, and thus the boost delay Tbd is shorter as the ideal boost delay T0 is.

By contrast, when production variations among the transistors are such that the word line driver 20 has lower driving capacity, the word line WL raising time is longer, and the ideal boost delay T0 is also longer (see FIG. 21, column (b) referred to previously). Here, the inverter chain 262 has accordingly lower driving capacity, and thus the boost delay Tbd is longer as is the ideal boost delay T0.

As described above, by configuring the delay stage 26 with inverter chains 261 and 262, it is possible to vary the boost delay Tbd properly in accordance with the ideal boost delay T0. It is thus possible to obtain a maximum effect of improving the data rewriting time Twr by the word line boost method.

Figure 23:
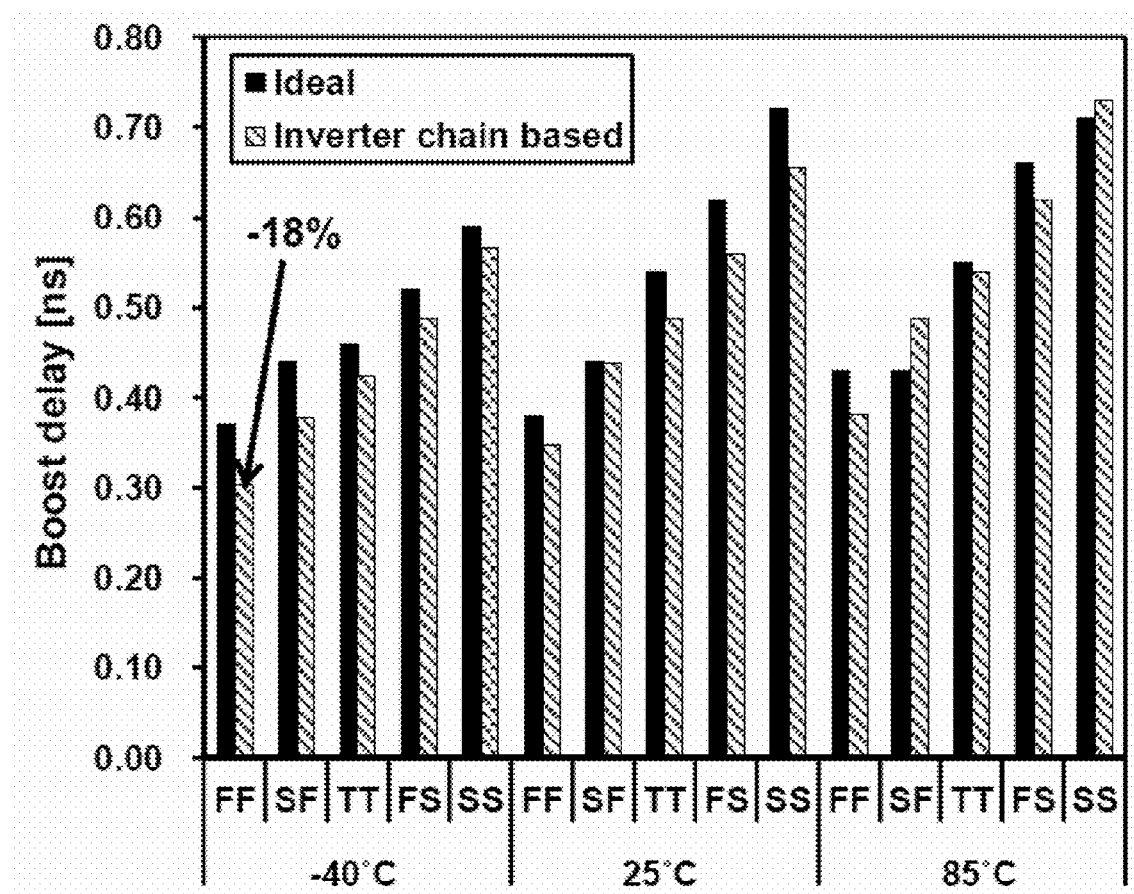
FIG. 23 is a diagram showing usefulness of a delay stage 26.

FIG. 23 is a diagram showing the usefulness of the delay stage 26. The boost delay Tbd generated by the delay stage 26 (inverter chains) is adjusted such that, in a TT corner at room temperature (25° C.), the boost delay Tbd equals the ideal boost delay T0. As shown in FIG. 23, the boost delay Tbd generated by the delay stage 26 equals the ideal boost delay T0 in any of process corners (FF. (fast/fast), SF (slow/fast), TT (typical/typical), FS (fast/slow), and SS (slow/slow)). The maximum deviation of the boost delay Tbd from the ideal boost delay T0 is −18% in the FF corner at −40° C.

FIG. 24 is a table showing the conditions for a SPICE simulation performed to evaluate the performance of the word line boost method. As shown there, the simulation was performed under the following conditions: process, 130 nm; temperature, 25° C.; supply voltage, 1.5 V; macro configuration, 16 bits per word; number of cells connected to a word line WL, 256; and number of cells connected to a bit line BL, 256.

Figure 25:
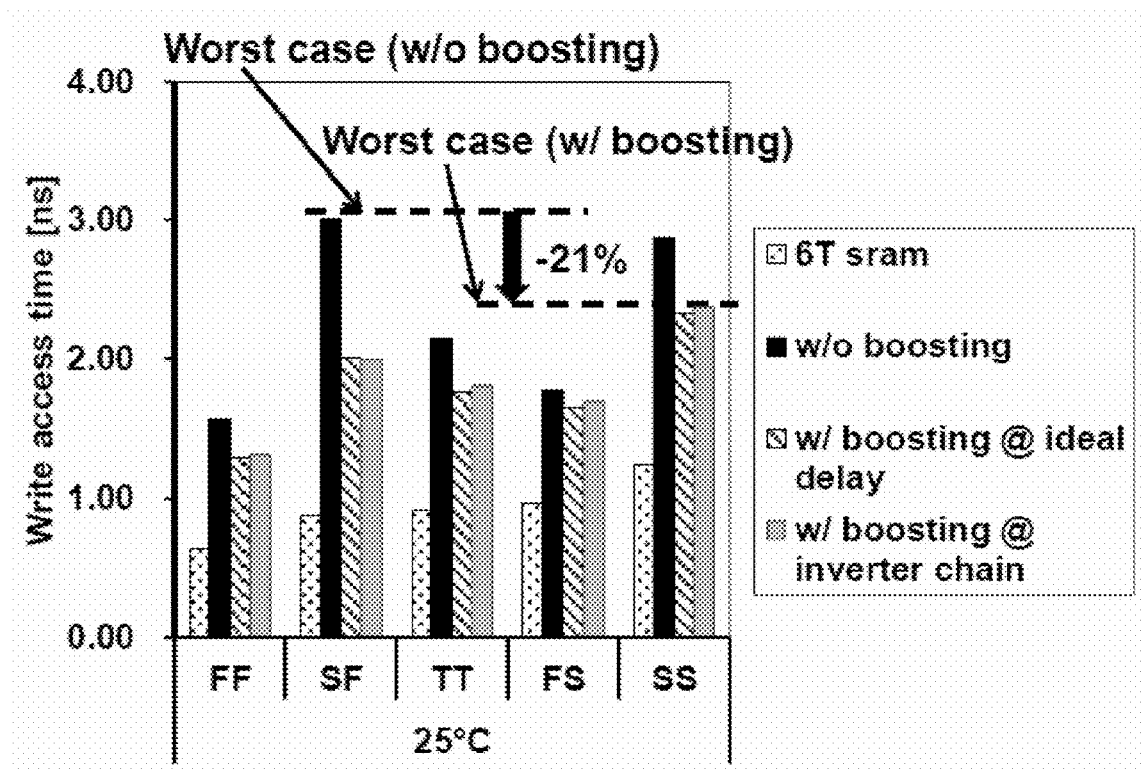
FIG. 25 is a diagram of comparison of write access times.

FIG. 25 is a diagram of comparison of write access times. As shown there, the SPICE simulation yielded results that indicated a 21% improvement in write access time at the minimum.

FIG. 26 is a table showing the results of a simulation of word line boosting (in the TT corner, at 25° C.). As shown there, adopting the word line boost method described above resulted in a 47.8% increase in the electric power consumption by the word line driver 20 compared with a configuration without a boost. However, in the 16-Kb memory block 1 as a whole, its electric power consumption increased only by a slight 1.3%.

Thus, with the word line boost method described above, a reduction as large as 21% in write access time is achieved at the cost of an increase as slight as 1.3% in electric power consumption.

Although the above description deals with, as an example, a word line driver that takes a ferroelectric shadow memory as a target of driving, this is not meant to limit the application of the word line boost method. The word line boost method described above can suitably be applied also in cases where the target of driving is, for example, a memory based on SRAM memory cells having a 6T structure wherein internal nodes are connected to a node capacitor having a higher capacitance than the parasitic capacitor Cp2.

Fourth Embodiment

To make a memory cell 11 (ferroelectric shadow memory) nonvolatile, it is necessary, before the shutting-off and restarting of the supply voltage VDD, to perform a data store/recall operation by pulse-driving plate lines PL1 and PL2 by use of the plate line driver 40.

However, the ferroelectric capacitors FC1 to FC4 connected to the plate lines PL1 and PL2 have a high capacitance, and thus charging the plate lines PL1 and PL2 up to predetermined potentials requires a long time. A description will be given below of a plate line driver boost method in which the driving capacity of the plate line driver 40 is augmented during a store/recall operation as a means for shortening the charging time of the plate lines PL1 and PL2 to achieve a high-speed store/recall operation.

Figure 27:
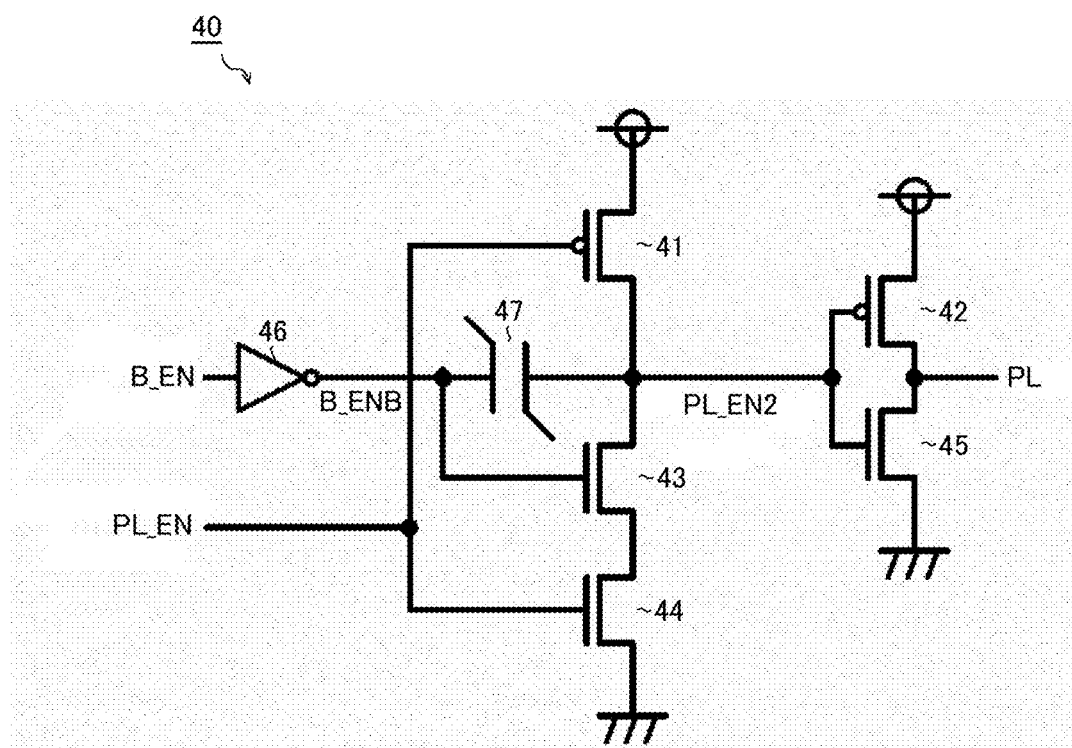
FIG. 27 is a circuit diagram showing one example of configuration of a plate line driver 40.

FIG. 27 is a circuit diagram showing one example of the configuration of the plate line driver 40. The plate line driver 40 includes P-channel type field-effect transistors 41 and 42, N-channel type field effect transistors 43 to 45, an inverter 46, and a ferroelectric capacitor 47.

The source of the transistor 41 is connected to a supply voltage node. The drains of transistors 41 and 43 are both connected to a node to which a second plate line enable signal PL_EN2 is applied (corresponding to a boost target node). The source of the transistor 43 is connected to the drain of the transistor 44. The source of the transistor 44 is connected to a ground node. The gates of the transistors 41 and 44 are both connected to a node to which a plate line enable signal PL_EN is applied. The gate of the transistor 43 is connected to the output terminal of the inverter 46 (a node to which an inverted boost enable signal B_ENB is applied). The input terminal of the inverter 46 is connected to a node to which a boost enable signal B_EN is applied. The ferroelectric capacitor 47 is connected between the output terminal of the inverter 46 and the node to which the second plate line enable signal PL_EN2 is applied. The source of the transistor 42 is connected to the supply voltage node. The drains of the transistors 42 and 45 are both connected to a plate line PL. The source of the transistor 45 is connected to the ground node. The gates of the transistors 42 and 45 are both connected to the node to which the second plate line enable signal PL_EN2 is applied.

The transistors 41 and 44 function as a first output stage (first inverter stage) which generates the second plate line enable signal PL_EN2 according to the plate line enable signal PL_EN. The transistors 42 and 45 function as a second output stage (second inverter stage) which drives the plate line of the memory cell 11 according to the plate line enable signal PL_EN. The transistor 43, the inverter 46, and the ferroelectric capacitor 47 function as a boost stage which augments the driving capacity of the second output stage by lowering the plate line enable signal PL_EN down to a negative voltage by driving the ferroelectric capacitor 47 (controlling its coupling or connection so as to perform charge pumping) according to the boost enable signal B_EN.

As in the word line driver 20 described previously, it is preferable to use, as the capacitor element provided in the boost stage, a ferroelectric capacitor 47, which has a high capacitance per unit area. However, the ferroelectric capacitor 47 may be replaced with a MOS capacitor, a MIM capacitor, or a MOM capacitor.

Figure 28:
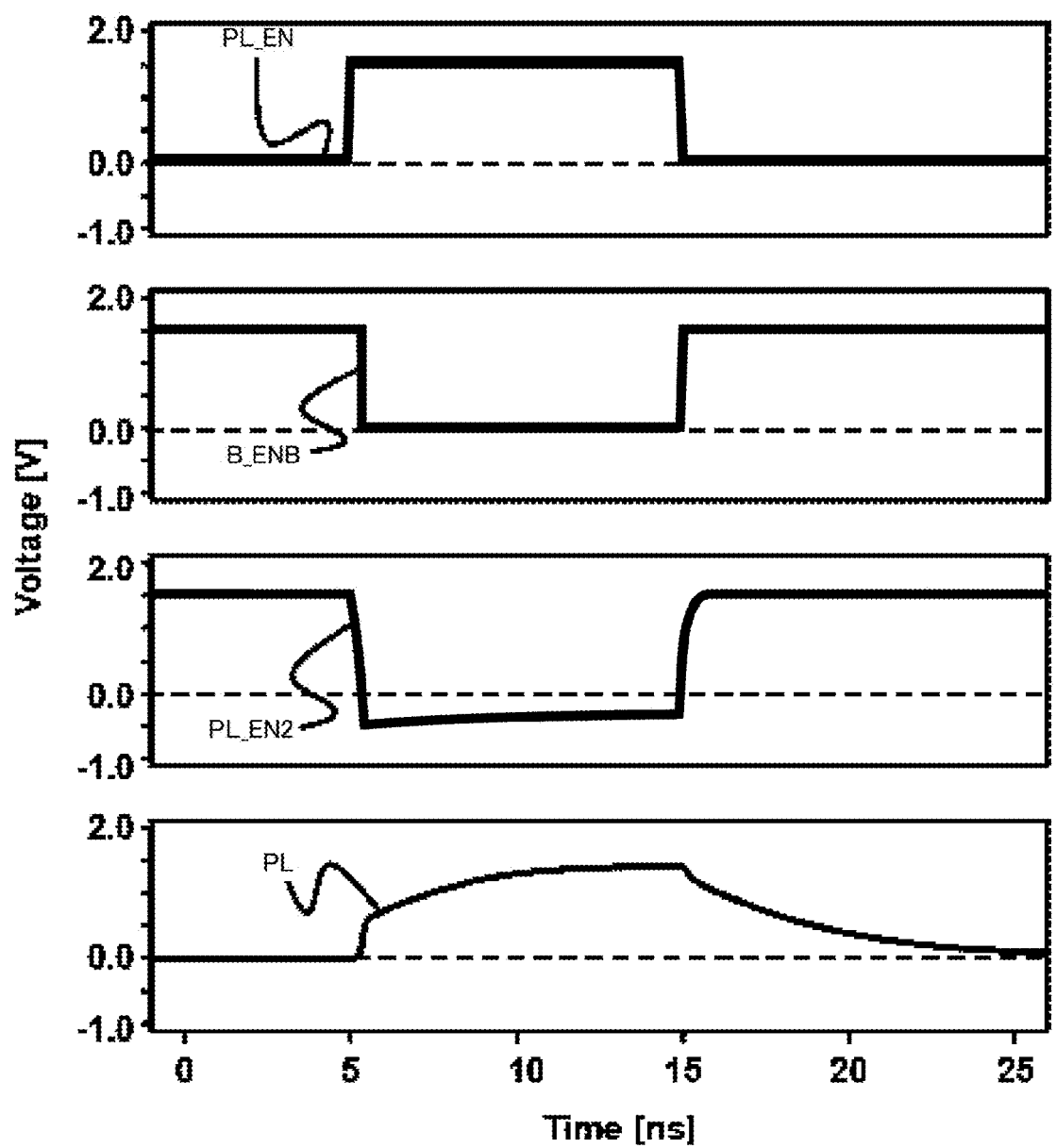
FIG. 28 is a timing chart showing one example of operation for plate line driver boosting.

FIG. 28 is a timing chart showing one example of operation for plate line driver boosting, and shows, from top down, the plate line enable signal PL_EN, the inverted boost enable signal B_ENB, the second plate line enable signal PL_EN2, and the voltage applied to the plate line.

In a store/recall operation in the memory cell 11, first, the plate line enable signal PL_EN is raised to high level, and the second plate-line enable signal PL_EN2 is lowered to low level. As a result, the transistor 42 turns on, and thus the voltage applied to the plate line gradually increases. At this point, the boost enable signal B_EN remains at low level, and the inverted boost enable signal B_ENB is kept at high level. Accordingly, a potential difference appears across the ferroelectric capacitor 47, and thus the ferroelectric capacitor 47 is charged.

Next, at the time point that the second plate line enable signal PL_EN2 becomes equal to the ground voltage GND, the boost enable signal B_EN turns to high level, and the inverted boost enable signal B_ENB is lowered to low level. At this point, electric charge has been charged across the ferroelectric capacitor 47, and thus according to the principle of charge conservation, the second plate line enable signal PL_EN2 is lowered down to a negative voltage (=GND−α).

As a result, the transistor 42 exhibits higher conductivity than when the second plate line enable signal PL_EN2 is made equal to the ground voltage GND (with no boost), and hence the driving capacity of the second output stage (the on-state current through the transistor 42) is augmented. In this way, by augmenting the driving capacity of the plate line driver 40 instead of increasing the high-level voltage on the plate line, it is possible to shorten the charging time of the plate line PL and achieve a high-speed store/recall operation.

FIG. 29 is a table showing the results of a simulation of plate line driver boosting (in a TT corner, at 25° C.). The conditions for the simulation were the same as those shown in FIG. 24 referred to previously. As shown in FIG. 29, adopting the plate line driver boost method described above resulted in a reduction as large as about 33% in the plate line charge time being achieved with an increase as slight as 0.43% in electric power consumption.

Figure 30:
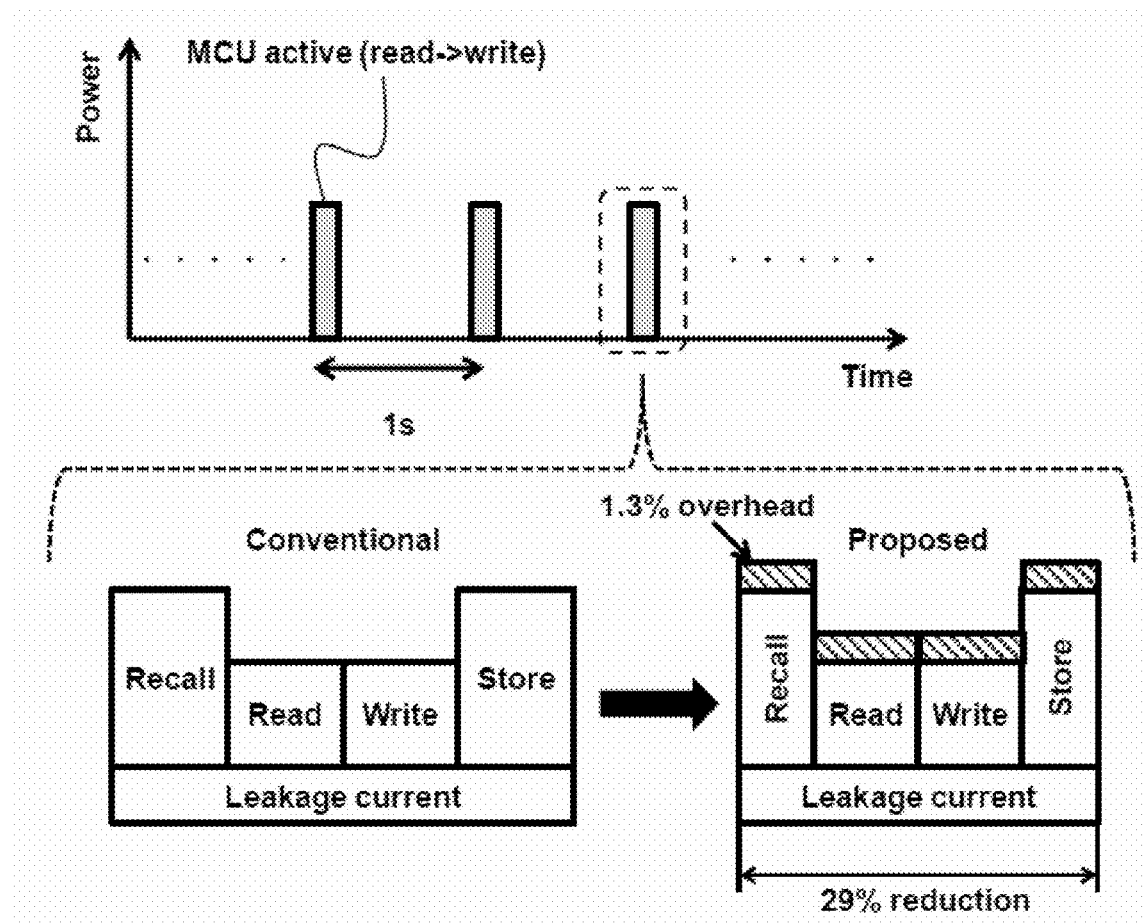
FIG. 30 is a conceptual diagram showing the effect of application to an intermittently started sensing application.
Figure 31:
FIG. 31 is a table of comparison of active periods.

FIG. 30 is a conceptual diagram showing workings and benefits on a system level (shortened active periods and reduced electric power consumption) as achieved in a case where the word line boost method and the plate line driver boost method described above are applied to a sensing application of an intermittently started type. FIG. 31 is a table of comparison of active periods (active times).

This evaluation assumes, as one example of an application of an intermittently started type, a sensor network for environmental monitoring. In this sensor network, the MCU (micro-controller unit) of a sensor recovers from a sleep state to an active state every one second, reads/writes 160-bit measurement data and arithmetically processes it, and then slips from an active state back into a sleep state. In a sleep state, the supply of electric power to the sensor is shut-off.

As shown in FIGS. 30 and 31, adopting the word line boost method alone resulted in a 4% reduction in active periods, and additionally adopting the plate line driver boost method resulted in a further 25% reduction in active periods. Ultimately, adopting the word line boost method and the plate line driver boost method together resulted in a 29% reduction in total access time being achieved with a 1.3% increase in active electric power at the maximum.

Fifth Embodiment

Figure 32:
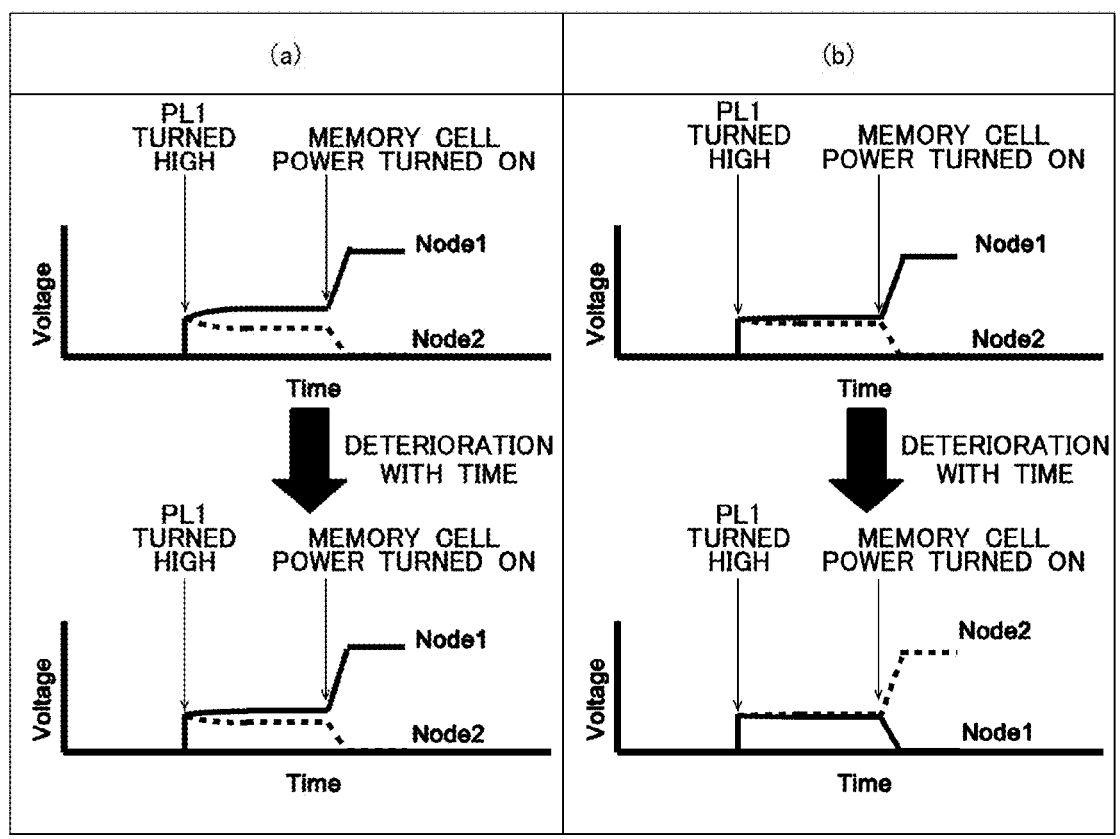
FIG. 32 is a diagram illustrating recall failure due to deterioration with time.

FIG. 32 is a diagram illustrating a recall failure due to deterioration with time. As shown in column (a) there, in a normal memory cell with a sufficiently wide recall margin (the potential difference between the internal nodes Node1 and Node2 appearing during a recall operation; referred to simply as the margin in the following description) at the time of manufacture, even if the margin is reduced slightly due to deterioration with time, data stored before power shut-off can be recalled correctly.

By contrast, as shown in column (b) there, in a defective memory cell with a small margin at the time of manufacture, even if a recall operation can be performed correctly immediately after shipping, as the margin is reduced due to deterioration with time, a recall failure becomes increasingly likely to occur. Thus, to enhance the reliability of the semiconductor memory device 100, it is important to test the margins of memory cells 11 in inspection prior to shipment to screen out defective memory cells.

Accordingly, a margin testing method will be proposed below for detection of defects in ferroelectric capacitors through arbitrary setting of a potential on bit lines from outside.

Figure 33:
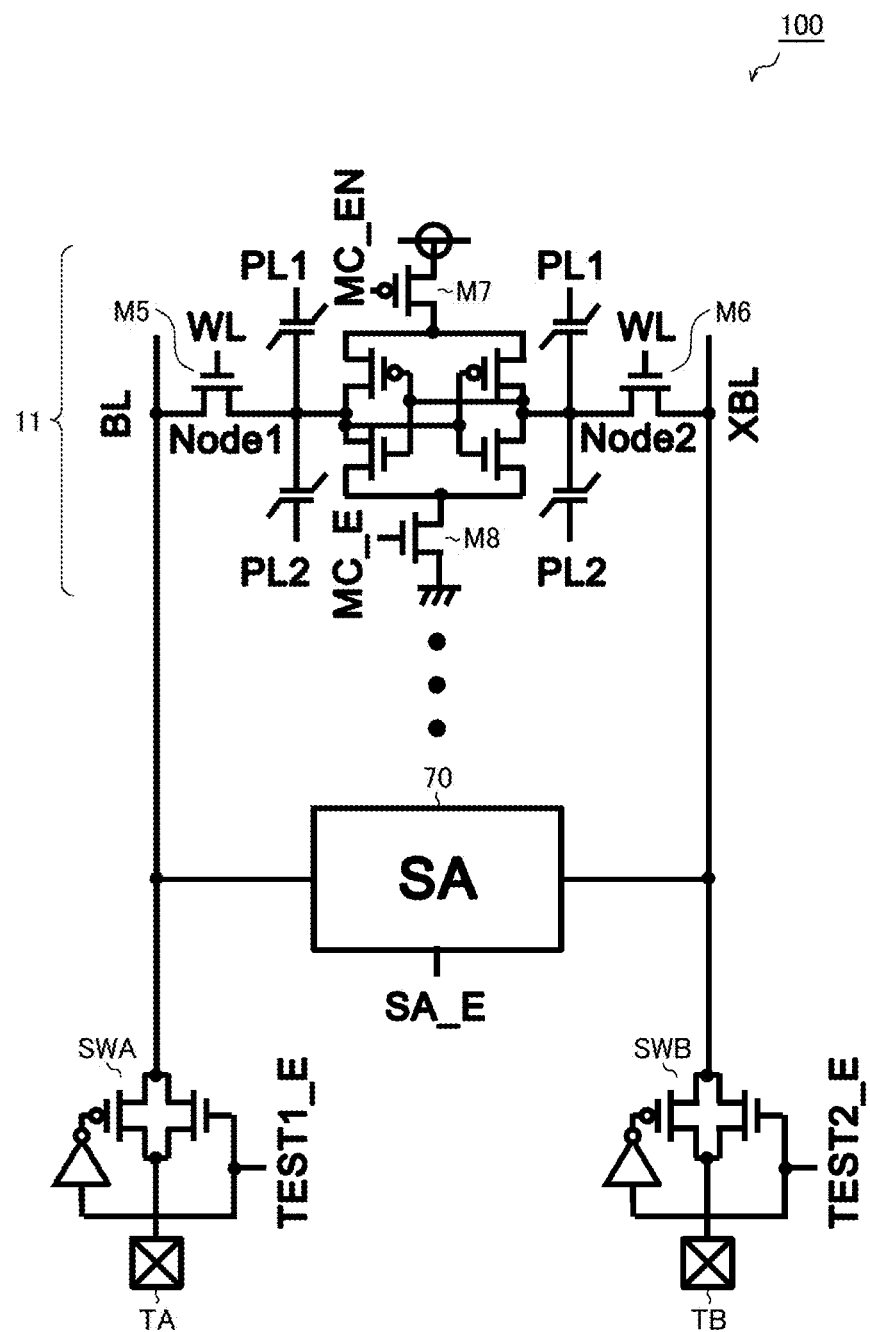
FIG. 33 is a circuit diagram showing a first example of configuration of a semiconductor memory device taken as a target of margin testing.

FIG. 33 is a circuit diagram showing a first example of the configuration of a semiconductor memory device taken as a target of margin testing. The semiconductor memory device 100 of this configuration example has a configuration similar to that shown in FIG. 2 and described previously, and includes external terminals TA and TB and transmission gates SWA and SWB.

The external terminal TA is a terminal via which an arbitrary analog voltage is applied to a bit line BL from outside the semiconductor memory device 100. The external terminal TB is a terminal via which an arbitrary analog voltage is applied to an inverted bit line XBL from outside the semiconductor memory device 100. The transmission gate SWA is connected between the external terminal TA and the bit line BL, and is turned on and off according to a test enable signal TEST1_E. The transmission gate SWB is connected between the external terminal TB and the inverted bit line XBL, and is turned on and off according to a test enable signal TEST2_E.

FIG. 33 specifically shows, as circuit components of the memory cell 11, power switches M7 and M8 for turning on and off the supply of electric power to the inverter loop. The power switch M7 is a P-channel type field-effect transistor connected between a supply power node and the inverter loop, and is turned on and off according to an inverted memory cell enable signal MC_EN. The power switch M8 is an N-channel type field effect transistor connected between the inverter loop and a ground node, and is turned on and off according to a memory cell enable signal MC_E.

It should be noted that the power switches M7 and M8 are simply omitted from illustration in FIG. 2, and are not circuit elements that are additionally provided in this configuration example. The read circuit 70 (sense amplifier) is switched between an enabled state and a disabled state according to a sense amplifier enable signal SA_E.

Figure 34:
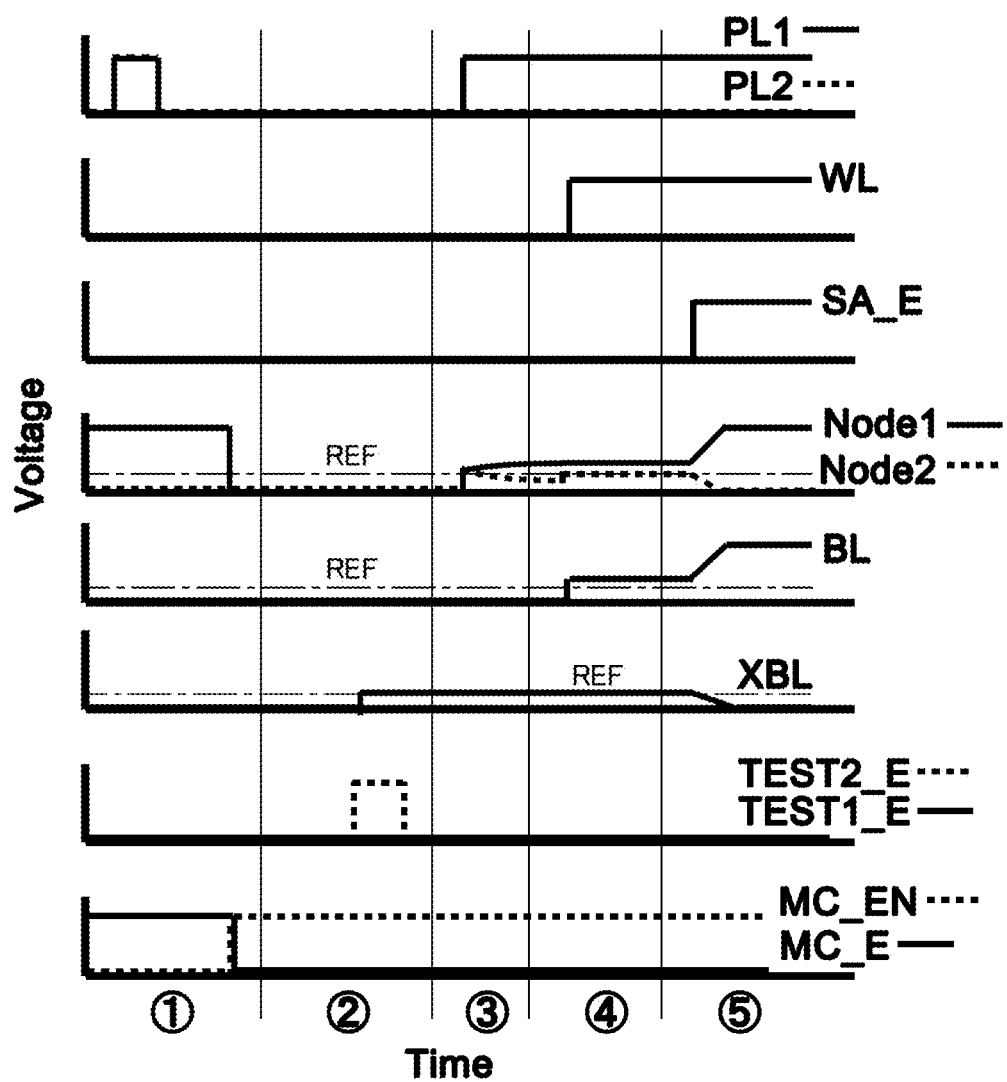
FIG. 34 is a timing chart showing a pass pattern in a first test.

FIG. 34 is a timing chart showing a pass pattern (acceptance pattern) in a first test that takes the semiconductor memory device 100 of the first configuration example (FIG. 33) as an inspection target, and shows the states of, from top down, the plate lines PL1 and PL2, the word line WL, the sense amplifier enable signal SA_E, the internal nodes Node1 and Node2, the bit line BL, the inverted bit line XBL, the test enable signals TEST1_E and TEST2_E, the memory cell enable signal MC_E, and the inverted memory cell enable signal MC_EN.

During period (1), the plate lines PL1 and PL2 are pulse-driven, so that data (in the example shown in FIG. 34, Node1=H, Node2=L) is stored in the ferroelectric capacitors FC1 to FC4. Thereafter, the memory cell enable signal MC_E is lowered to low level and the inverted memory cell enable signal MC_EN is raised to high level, and thereby the power switches M7 and M8 are both turned off, so that the supply of electric power to the inverter chains are shut off.

During period (2), the test enable signal TEST2_E is raised to and kept at high level for a predetermined period, so that the transmission gate SWB is turned on, and an arbitrary reference voltage REF is applied from the external terminal TB to the inverted bit line XBL.

During period (3), with the inverter loop disabled (MC_E=L, MC_EN=H), the plate line PL1 is pulse-driven (raised to high level), so that a recall operation is performed in the memory cell 11. At this point, voltages wkH and wkL reflecting the residual polarization states of ferroelectric capacitors FC1 to FC4 appear at the internal nodes Node1 and Node2 respectively.

During period (4), the word line WL is raised to high level and the transistors M5 and M6 are both turned on, so that potentials are made equal between the internal node Node1 and the bit line BL and between the internal node Node2 and the inverted bit line XBL. That is, the bit line BL and the internal node Node1 are now both at the voltage wkH, and the inverted bit line XBL and the internal node Node2 are now both at the reference voltage REF.

During period (5), the sense amplifier enable signal SA_E is raised to high level, and the read circuit 70 performs a read operation. Specifically, between the bit line BL and the inverted bit line XBL, the voltages applied to them, namely the voltage wkH and the reference voltage REF, are compared.

In the example shown in FIG. 34, the voltage wkH which is recalled to the internal node Node1 is higher than the reference voltage REF. Thus, by the differential amplification action of the read circuit 70, the bit line BL and the internal node Node1 are raised to high level, and the inverted bit line XBL and the internal node Node2 are lowered to low level. This state is identical with the state before power shut-off, and thus the inspection result is a pass (acceptance).

Figure 35:
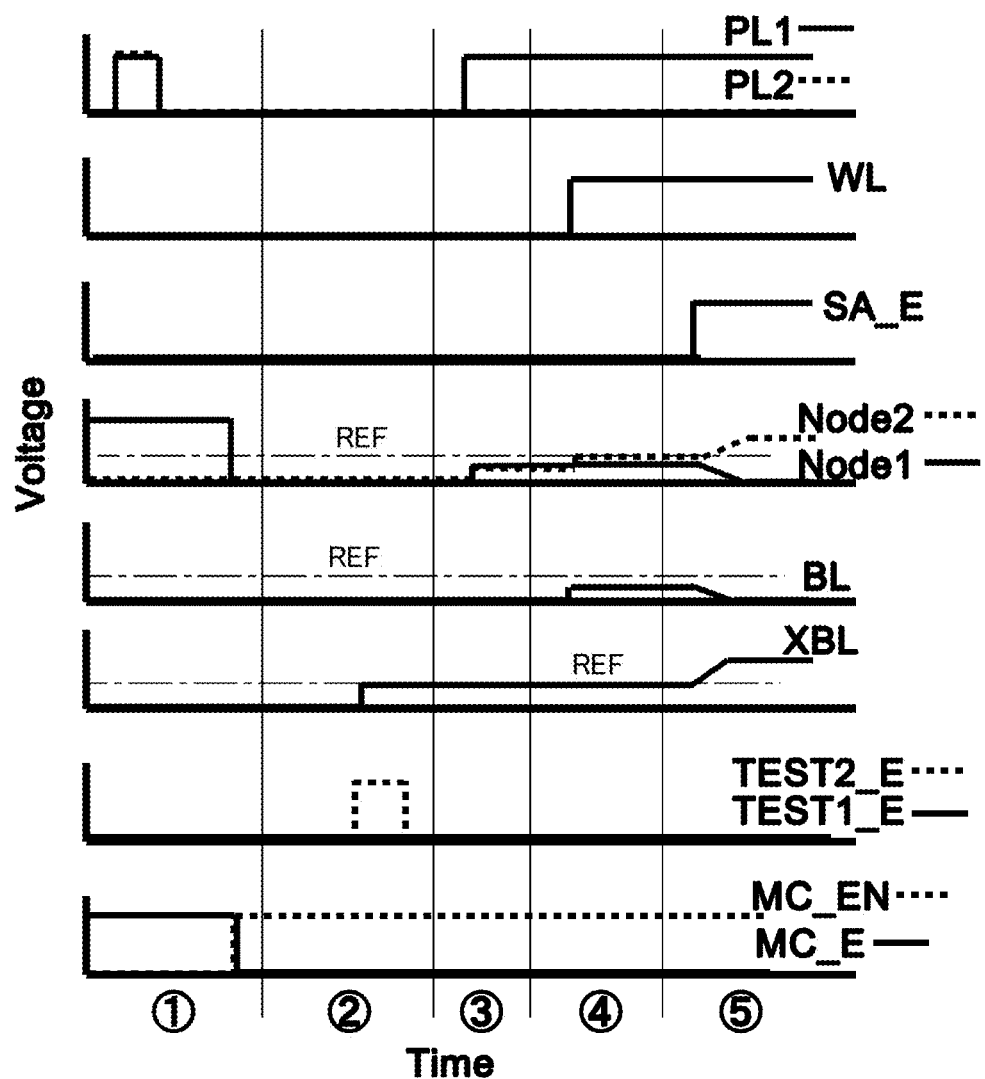
FIG. 35 is a timing chart showing a fail pattern in a first test.

FIG. 35 is a timing chart showing a fail pattern (rejection pattern) in the first test that takes the semiconductor memory device 100 of the first configuration example (FIG. 33) as an inspection target, and shows the states of, from top down, the plate lines PL1 and PL2, the word line WL, the sense amplifier enable signal SA_E, the internal nodes Node1 and Node2, the bit line BL, the inverted bit line XBL, the test enable signals TEST1_E and TEST2_E, and the inverted memory cell enable signal MC_EN.

The sequence of testing operations through periods (1) through (5) itself is the same as in FIG. 34 referred to above. The difference is that, in the example shown in FIG. 35, the voltage wkH recalled to the internal node Node1 is lower than the reference voltage REF. Thus, by the differential amplification action of the read circuit 70, the bit line BL and the internal node Node1 are lowered to low level, and the inverted bit line XBL and the internal node Node2 are raised to high level. This state is opposite to the state before power shut-off, and thus the inspection result a fail (rejection).

Incidentally, it is possible to know the absolute value of the voltage wkH recalled to the internal node Node1 by finding the above-described test result (pass/fail) successively while sweeping the reference voltage REF applied to the inverted bit line XBL. For example, if a test applying as the reference voltage REF a voltage REF1 results in a pass and a test applying a voltage REF2 results in a fail, then it is found that REF1<wkH<REF2.

Moreover, during period (2), by raising the test enable signal TEST1_E to high level, it is possible to turn on the transmission gate SWA and apply an arbitrary reference voltage REF from the external terminal TA to the bit line BL. Thus, in a similar manner as described just above, by finding the above-described test result successively while sweeping the reference voltage REF applied to the bit line BL, it is also possible to know the absolute value of the voltage wkL recalled to the internal node Node2.

As described above, by knowing the absolute values of the voltages wkH and wkL recalled to the internal nodes Node1 and Node2, it is possible to test the margin Vm (=wkH−wkL) of the memory cell 11. It is thus possible, in inspection before shipment, to screen out defective memory cells that are likely to end in a recall failure due to deterioration with time.

In a case where the external terminals TA and TB are shared among a plurality of memory cells 11, it is preferable that, for those memory cells which are not a target of testing, the bit line BL (or the inverted bit line XBL) to which the reference voltage REF is applied be kept short-circuited to the plate lines PL1 and PL2. With this configuration, no data corruption occurs in memory cells that are not a target of testing, and this eliminates the need to rewrite data when those memory cells are a target of testing.

Figure 36:
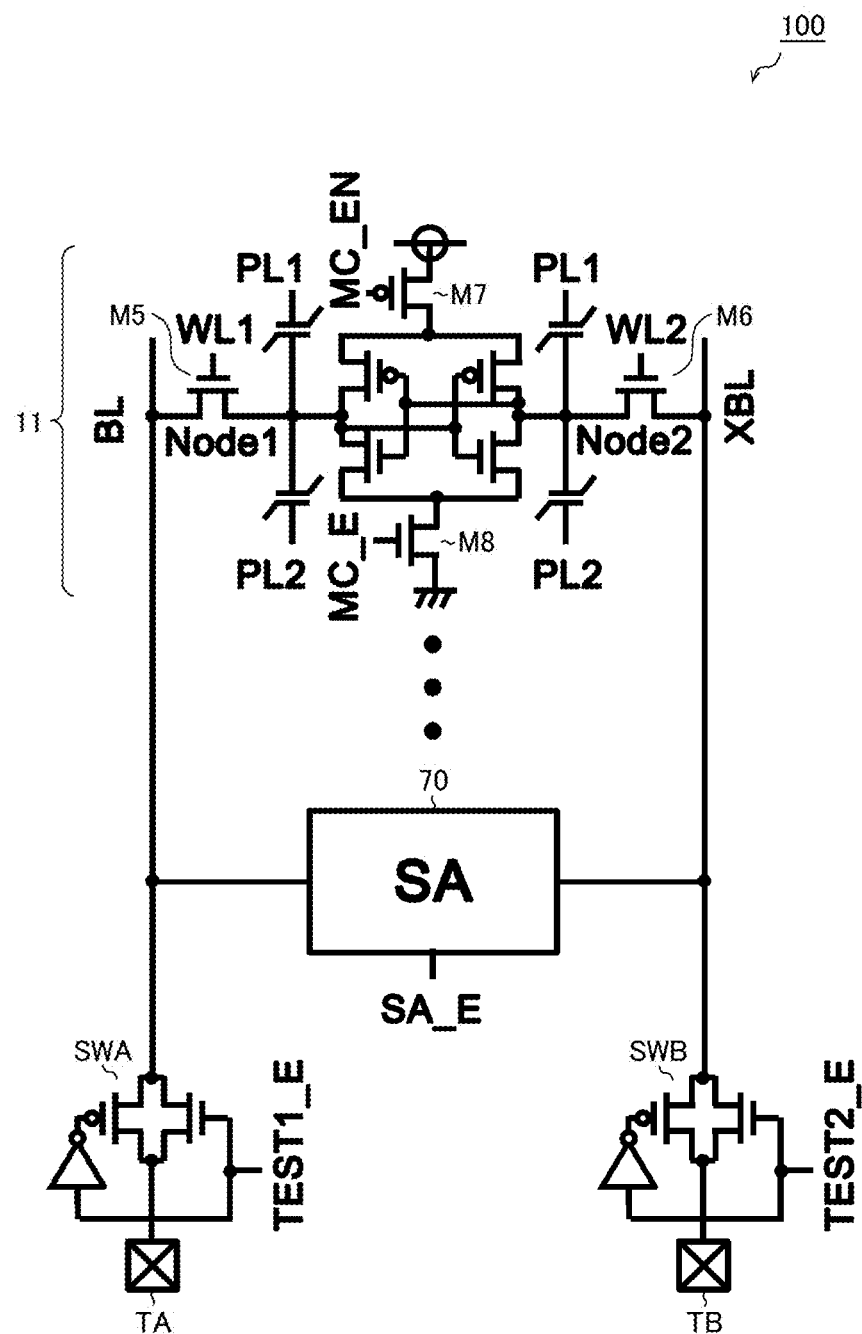
FIG. 36 is a circuit diagram showing a second example of configuration of a semiconductor memory device taken as a target of margin testing.

FIG. 36 is a circuit diagram showing a second example of the configuration of a semiconductor memory device taken as a target of margin testing. The semiconductor memory device 100 of this configuration example has a configuration basically similar to that shown in FIG. 33 referred to previously, a difference being that, here, there are separately and independently provided a word line WL1 connected to the gate of the transistor M5 and a word line WL2 connected to the gate of the transistor M6.

Figure 37:
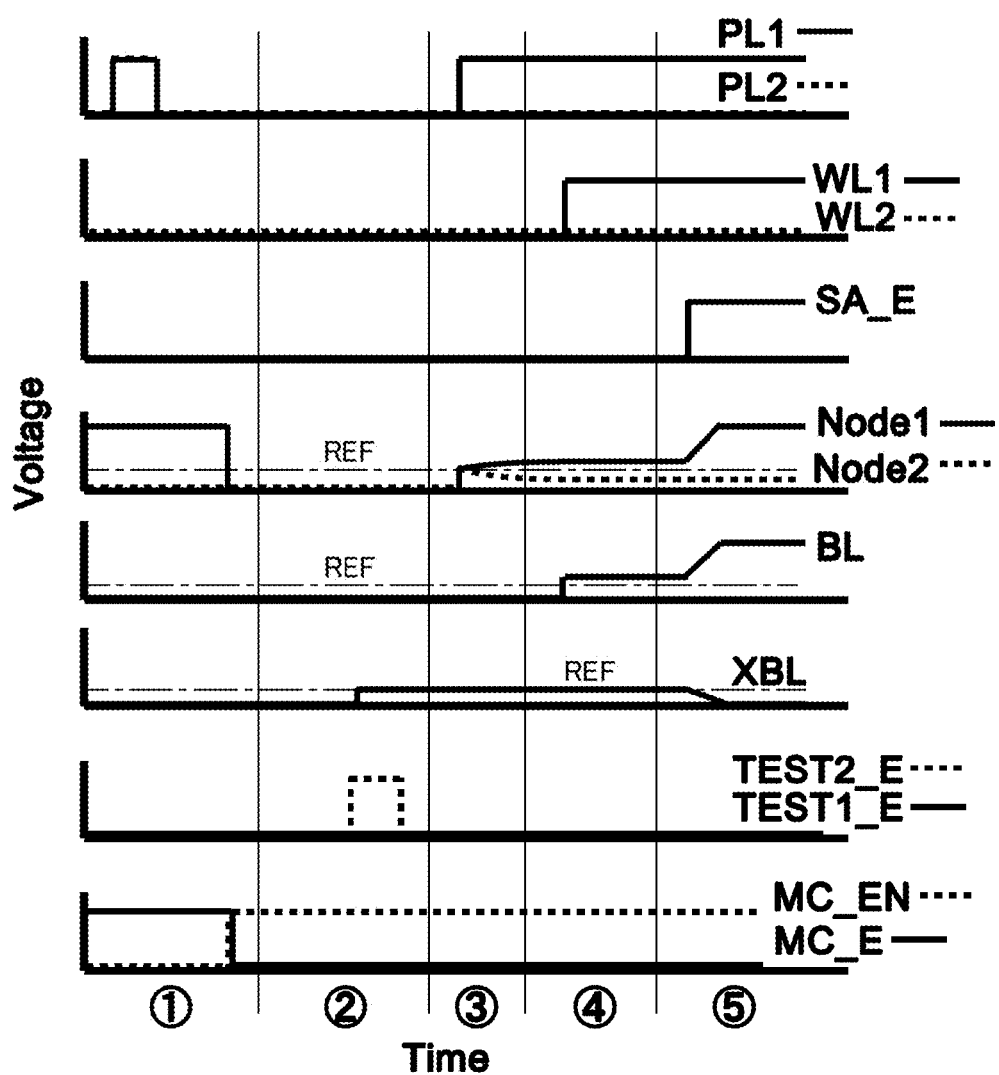
FIG. 37 is a timing chart showing a pass pattern in a second test.
Figure 38:
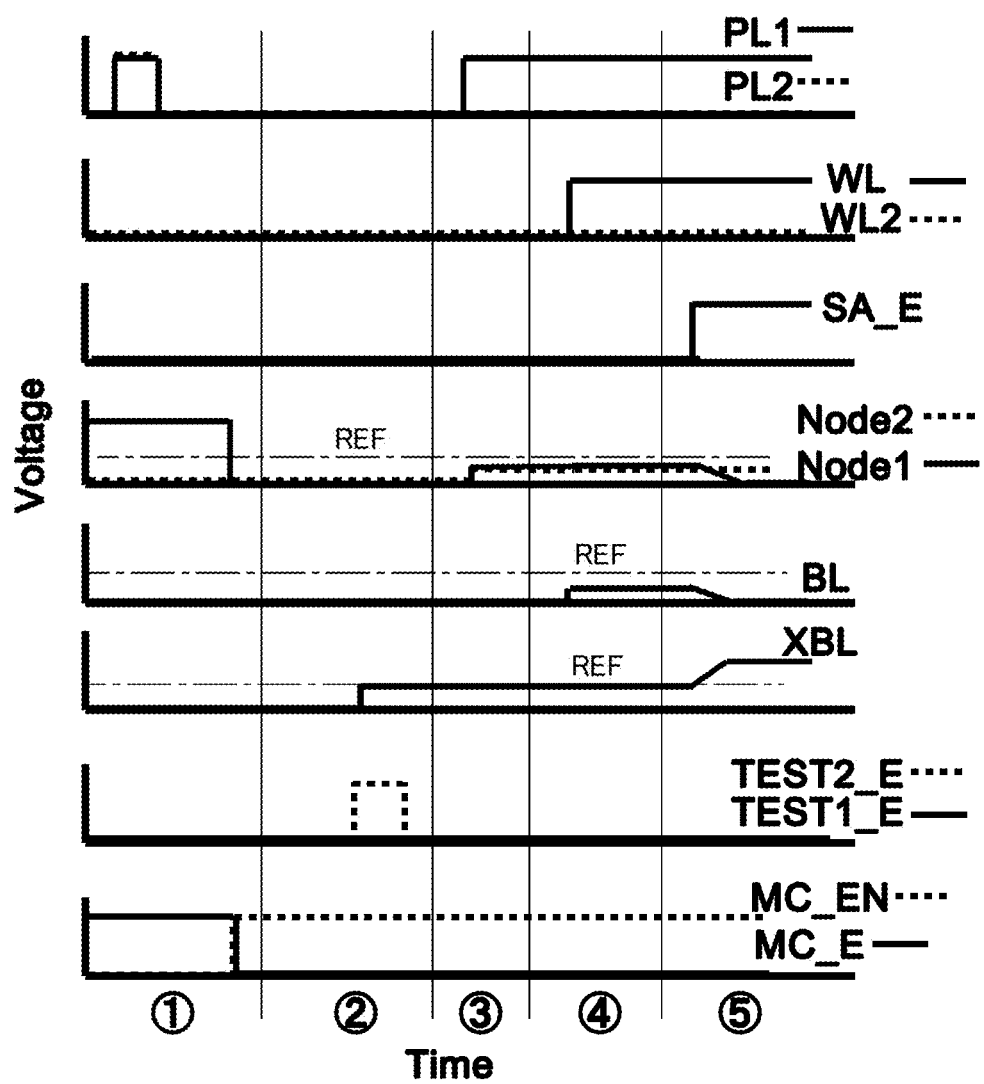
FIG. 38 is a timing chart showing a fail pattern in a second test.

FIGS. 37 and 38 are timing charts showing a pass pattern and a fail pattern, respectively, in a second test that takes the semiconductor memory device 100 of the second configuration example (FIG. 36) as an inspection target, and shows the states of, from top down, the plate lines PL1 and PL2, the word lines WL1 and WL2, the sense amplifier enable signal SA_E, the internal nodes Node1 and Node2, the bit line BL, the inverted bit line XBL, the test enable signals TEST1_E and TEST2_E, the memory cell enable signal MC_E, and the inverted memory cell enable signal MC_EN.

The sequence of testing operations through periods (1) through (5) itself is basically the same as in FIGS. 34 and 35 referred to previously. A difference is that, in the second test, during period (4), the word line WL1 is turned to high level, while the word line WL2 is kept at low level. That is, of the transistors M5 and M6, only the transistor M5, to which the reference voltage REF is not applied, is turned on, while the transistor M6 is kept off.

As a result, the internal node Node2 is kept in a state cut off from the inverted bit line XBL to which the reference voltage REF is applied, and thus keeps holding the voltage wkL obtained through the recall operation.

With this configuration, even when the reference voltage REF is applied to the inverted bit line XBL, no data corruption occurs at the internal node Node2. Thus, after the measurement of the absolute value of the voltage at the internal node Node1, when the reference voltage REF is applied to the bit line BL to measure the absolute value at the internal node Node2, there is no need to rewrite data to the memory cell 11.

Figure 39:
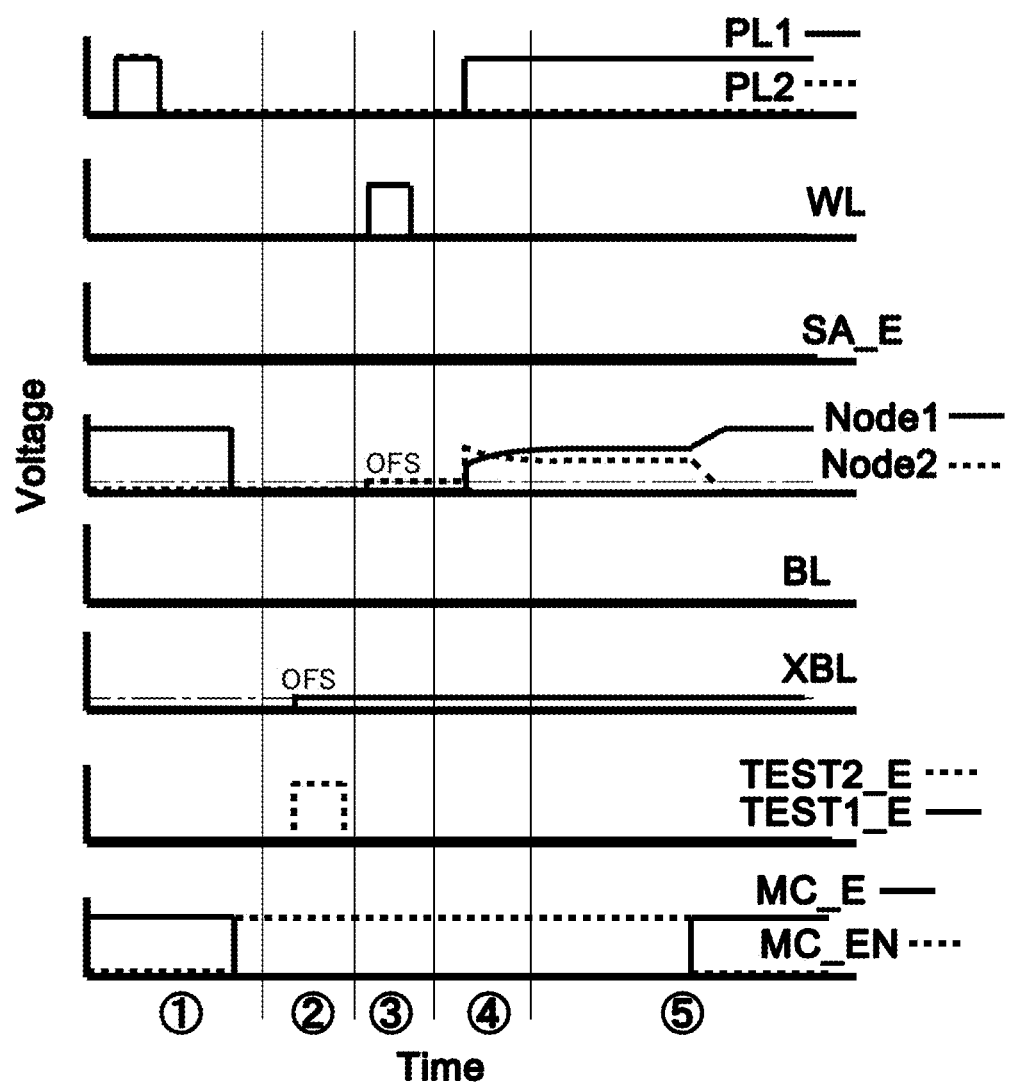
FIG. 39 is a timing chart showing a pass pattern in a third test.

FIG. 39 is a timing chart showing a pass pattern (acceptance pattern) in a third test that takes the semiconductor memory device 100 of the first configuration example (FIG. 33) as an inspection target, and shows the states of, from top down, the plate lines PL1 and PL2, the word line WL, the sense amplifier enable signal SA_E, the internal nodes Node1 and Node2, the bit line BL, the inverted bit line XBL, the test enable signals TEST1_E and TEST2_E, the memory cell enable signal MC_E, and the inverted memory cell enable signal MC_EN.

During period (1), the plate lines PL1 and PL2 are pulse-driven, so that data (in the example shown in FIG. 39, Node1=H, Node1=L) is stored in the ferroelectric capacitors FC1 to FC4. Thereafter, the memory cell enable signal MC_E is lowered to low level and the inverted memory cell enable signal MC_EN is raised to high level, and thereby the power switches M7 and M8 are both turned off, so that the supply of electric power to the inverter chains are shut off.

During period (2), the test enable signal TEST2_E is raised to and kept at high level for a predetermined period, so that the transmission gate SWB is turned on, and an arbitrary offset voltage OFS is applied from the external terminal TB to the inverted bit line XBL. It is preferable that, meanwhile, the bit line BL be kept connected to the ground terminal.

During period (3), the word line WL is raised to high level and the transistors M5 and M6 are both turned on, so that potentials are made equal between the internal node Node1 and the bit line BL and between the internal node Node2 and the inverted bit line XBL. As a result, the internal node Node1 is now at the ground voltage GND, and the internal node Node2 is now at the offset voltage OFS. In this way, in the third test, prior to a recall operation in the memory cell 11, an offset is given between the internal nodes Node1 and Node2. The offset voltage OFS is for stricter setting of the margin Vm of the memory cell 11. Accordingly, the offset voltage OFS is fed to that internal node to which the relatively low voltage wkL is recalled (in the example shown in FIG. 39, the internal node Node2).

During period (4), with the inverter loop disabled (MC_E=L, MC_EN=H), the plate line PL1 is pulse-driven (raised to high level), so that a recall operation is performed in the memory cell 11. At this point, voltages wkH and wkL reflecting the residual polarization states of ferroelectric capacitors FC1 to FC4 appear at the internal nodes Node1 and Node2 respectively. However, since the internal node Node2 has been raised up to the offset voltage OFS prior to the recall operation in the memory cell 11, the voltage level there after the recall operation equals (wkL+OFS).

During period (5), the inverter loop is brought into an enabled state (MC_E=H, MC_EN=L), and thus the logic levels at the internal nodes Node1 and Node2 are definitively determined. In the example shown in FIG. 39, the voltage wkH which is recalled to the internal node Node1 is higher than the voltage including the offset (wkL+OFS) which is recalled to the internal node Node2. Thus, by the amplification action of the inverter loop, the internal node Node1 is raised to high level, and the internal node Node2 is lowered to low level. This state is identical with the state before power shut-off, and thus the inspection results is a pass (acceptance). Incidentally, whether or not a recall result in the memory cell 11 is correct can be known by performing an ordinary recall operation by use of the read circuit 70 and comparing voltages between the bit line BL and the inverted bit line XBL.

Figure 40:
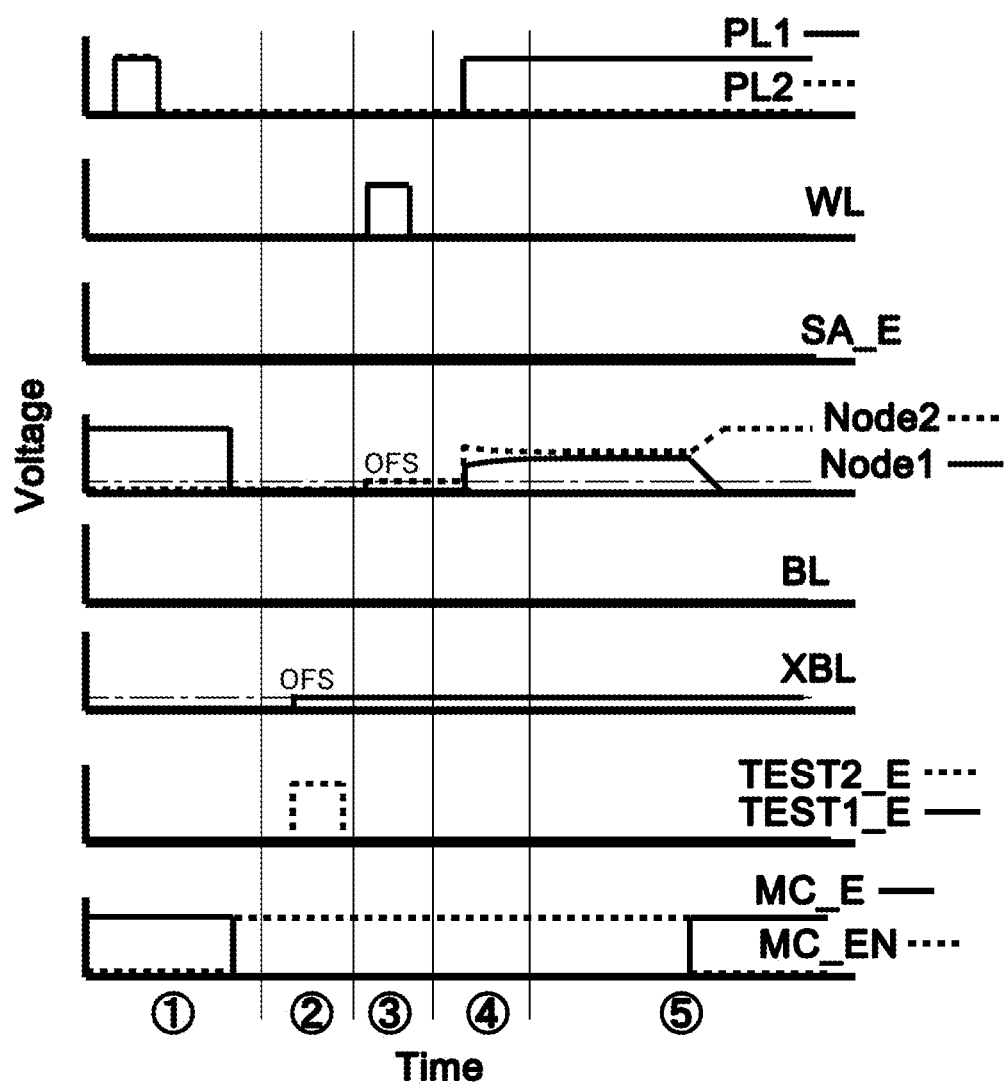
FIG. 40 is a timing chart showing a fail pattern in a third test.

FIG. 40 is a timing chart showing a fail pattern (rejection pattern) in the third test that takes the semiconductor memory device 100 of the first configuration example (FIG. 33) as an inspection target, and shows the states of, from top down, the plate lines PL1 and PL2, the word line WL, the sense amplifier enable signal SA_E, the internal nodes Node1 and Node2, the bit line BL, the inverted bit line XBL, the test enable signals TEST1_E and TEST2_E, the memory cell enable signal MC_E, and the inverted memory cell enable signal MC_EN.

The sequence of testing operations through periods (1) through (5) itself is the same as in FIG. 39 referred to previously. The difference is that, in the example shown in FIG. 40, the voltage wkH which is recalled to the internal node Node1 is lower than the voltage including the offset (wkL+OFS) which is recalled to the internal node Node2. Thus, by the amplification action of the inverter loop, the internal node Node1 is lowered to low level, and the internal node Node2 is raised to high level. This state is opposite to the state before power shut-off, and thus the inspection result is a fail (rejection).

Incidentally, it is possible to know the absolute value of the margin Vm of the memory cell 11 by finding the above-described test result (pass/fail) successively while sweeping the offset voltage OFS applied to the inverted bit line XBL. For example, if a test applying as the offset voltage OFS a voltage OFS1 results in a pass and a test applying a voltage OFS2 results in a fail, then it is found that OFS1<Vm<OFS2.

With the first or second test described previously, it is necessary to perform unordinary operations involving extracting a node voltage before definitive determination of logic levels by the inverter loop to the bit line BL (or the inverted bit line XBL) and comparing it with a reference voltage REF by use of the read circuit 70. By contrast, with the third test, an offset voltage OFS has only to be applied prior to a recall operation so that thereafter, through a recall operation and a read operation as ordinarily performed, the margin Vm of the memory cell 11 can be tested. Thus, it is possible to perform a margin test with more realistic characteristics (with no dependence on the parasitic capacitance of bit lines BL and the like), and hence with higher accuracy.

Moreover, with the third test, unlike the first or second test described previously, it is possible to test the margin Vm of the memory cell 11 more directly without individually measuring the absolute values of the voltages recalled to the internal nodes Node1 and Node2 respectively. Thus, it is possible to reduce the time required by a margin test compared with the first and second tests.

Other Modifications

The different technical features disclosed herein can be implemented in any other manners than specifically described above and allow for many modifications without departure from the spirit of the invention. For example, although the embodiments described in detail above deal with a ferroelectric shadow memory having a 6T-4C structure as an example, this is not meant to limit the structure of the ferroelectric shadow memory; a 6T-2C structure may instead be adopted by omitting the ferroelectric capacitors FC3 and FC4 (or the ferroelectric capacitors FC1 and FC2).

That is, the embodiments described above should be considered to be in every aspect simply illustrative and not restrictive, and it should be understood that the technical scope of the present invention is defined not by the description of embodiments given above but by the appended claims and encompasses any modifications in the sense and scope equivalent to those of the appended claims.

INDUSTRIAL APPLICABILITY

The present invention can be suitably used as a data buffer in applications where "lower standby electric power during sleep periods" and "maximized sleep periods" are sought (e.g., in sensor networks with low active factors and in living body monitoring).

What is claimed is:

1. A semiconductor memory device comprising:
a plurality of memory cells;
a plurality of plate lines respectively connected to the plurality of memory cells;
a plate line driver operable to drive the plurality of plate lines individually; and
a memory controller operable to control access to the plurality of memory cells,
wherein the plurality of memory cells each include:
an inverter loop connected between a first node and a second node;
a first access transistor connected between the first node and a bit line;
a second access transistor connected between the second node and an inverted bit line;
a first ferroelectric capacitor connected between the first node and a plate line; and
a second ferroelectric capacitor connected between the second node and the plate line,
wherein, when restoring/recalling data in the memory cells, the memory controller pulse-drives the plurality of plate lines sequentially by use of the plate line driver and meanwhile, before pulse-driving an uncharged plate line by use of the plate line driver, the memory controller performs charge sharing between a charged plate line and the uncharged plate line.

2. The semiconductor memory device according to claim 1, further comprising:
a plurality of transmission gates each connected between adjacent plate lines,
wherein, before pulse-driving the uncharged plate line by use of the plate line driver, the memory controller turns on a transmission gate between the charged plate line and the uncharged plate line.

3. The semiconductor memory device according to claim 1, wherein
when an output enable signal from the plate line driver turns to a first logic level, one of adjacent plate lines is charged up to a first voltage,
when the output enable signal turns to a second logic level, the one of the adjacent plate lines is brought into a floating state,
when the transmission gate is turned on, a path between the adjacent plate lines conducts, and charge sharing is performed until voltages on the adjacent plate lines are equal,
when the transmission gate is turned off, the path between the adjacent plate lines is cut off, and
when the output enable signal turns to the first logic level again, another of the adjacent plate lines is charged up to a first voltage, and the one of the adjacent plate lines is discharged down to a second voltage.

4. The semiconductor memory device according to claim 1, wherein
the plate line driver drives the plurality of plate lines sequentially, one at a time.

5. The semiconductor memory device according to claim 1, wherein
the plate line driver drives the plurality of plate lines a plurality of them at a time, in a plurality of steps.

6. The semiconductor memory device according to claim 1, further comprising:
a plurality of second plate lines respectively connected to the plurality of memory cells, wherein
the plurality of memory cells each further include:
a third ferroelectric capacitor connected between the first node and a second plate line; and
a fourth ferroelectric capacitor connected between the second node and the second plate line, and
when restoring/recalling data in the memory cells, the memory controller performs, by using the plate line driver, both charge sharing among the plurality of plate lines and charge sharing among the plurality of second plate lines.

7. The semiconductor memory device according to claim 1, wherein
the inverter loop includes:
a first load transistor of which a source is connected to a first potential terminal, a drain is connected to the first node, and a gate is connected to the second node;
a second load transistor of which a source is connected to the first potential terminal, a drain is connected to the second node, and a gate is connected to the first node;
a first drive transistor of which a source is connected to a second potential terminal, a drain is connected to the first node, and a gate is connected to the second node; and
a second drive transistor of which a source is connected to the second potential terminal, a drain is connected to the second node, and a gate is connected to the first node.

8. The semiconductor memory device according to claim 1, wherein
the first and second access transistors are each turned on and off according to a voltage applied to a word line connected to a gate thereof.

9. The semiconductor memory device according to claim 1, wherein
in a write operation in the memory cells, first the first and second access transistors are turned on, and then the bit line and the inverted bit line are held at logic levels corresponding to written data.

10. The semiconductor memory device according to claim 1, wherein in a read operation in the memory cells, first the bit line and the inverted bit line are brought into a floating state, and then the first and second access transistors are turned on.

11. The semiconductor memory device according to claim 1, wherein in a store operation in the memory cells, the plate lines are pulse-driven so as to determine residual polarization states of the first and second ferroelectric capacitors.

12. The semiconductor memory device according to claim 1, wherein in a recall operation in the memory cells, the plate lines are pulse-driven so that voltages that reflect residual polarization states of the first and second ferroelectric capacitors are induced at the first and second nodes.

* * * * *